(12) United States Patent
Okumura

(10) Patent No.: US 8,269,872 B2
(45) Date of Patent: Sep. 18, 2012

(54) ANALOG-TO-DIGITAL CONVERTER, ANALOG-TO-DIGITAL CONVERTING METHOD, SOLID-STATE IMAGE PICKUP DEVICE, AND CAMERA SYSTEM

(75) Inventor: Kenichi Okumura, Kanagawa (JP)

(73) Assignee: Sony Corporation, Tokyo (JP)

( * ) Notice: Subject to any disclaimer, the term of this patent is extended or adjusted under 35 U.S.C. 154(b) by 479 days.

(21) Appl. No.: 12/393,847

(22) Filed: Feb. 26, 2009

(65) Prior Publication Data
US 2009/0237535 A1 Sep. 24, 2009

(30) Foreign Application Priority Data

Mar. 18, 2008 (JP) ................................. 2008-070012

(51) Int. Cl.
H04N 3/14 (2006.01)
H04N 5/335 (2011.01)
H03M 1/34 (2006.01)

(52) U.S. Cl. ........................................ 348/308; 341/164

(58) Field of Classification Search .................. 348/294, 348/308, 310; 341/155, 159, 164, 165
See application file for complete search history.

(56) References Cited

U.S. PATENT DOCUMENTS

| | | | |
|---|---|---|---|
| 3,849,775 A | 11/1974 | Buchanan et al. | |
| 4,739,305 A | 4/1988 | Naito | |
| 5,877,715 A | 3/1999 | Gowda | |
| 6,639,539 B1 | 10/2003 | Loreck | |
| 6,670,904 B1 | 12/2003 | Yakovlev | |
| 2005/0195304 A1 | 9/2005 | Nitta et al. | |
| 2008/0111905 A1* | 5/2008 | Toyama et al. | ............... 348/308 |

FOREIGN PATENT DOCUMENTS

| | | |
|---|---|---|
| JP | 05-083135 | 4/1993 |
| JP | 2003-198371 | 7/2003 |
| JP | 2007-132905 | 5/2007 |
| JP | 2008-054256 | 3/2008 |
| JP | 2009-218964 | 9/2009 |

* cited by examiner

*Primary Examiner* — Alicia M Harrington
(74) *Attorney, Agent, or Firm* — Robert J. Depke; Rockey, Depke & Lyons, LLC

(57) ABSTRACT

An analog-to-digital converter that converts an analog input signal into a digital signal includes a comparator configured to compare a reference signal with an input signal and, if the input signal matches the reference signal, inverts an output; a counter configured to count a comparison time of the comparator; a control circuit configured to monitor the output of the comparator; a voltage generating circuit configured to generate, if a monitoring result obtained by the control circuit indicates that the output of the comparator is at a predetermined level, a direct current voltage in accordance with the monitoring result; and an analog adder configured to add the voltage generated by the voltage generating circuit to the input signal and supply a sum signal to an input terminal of the comparator.

19 Claims, 16 Drawing Sheets

US 8,269,872 B2

ANALOG-TO-DIGITAL CONVERTER, ANALOG-TO-DIGITAL CONVERTING METHOD, SOLID-STATE IMAGE PICKUP DEVICE, AND CAMERA SYSTEM

The present application claims priority to Japanese Patent Application JP2008-070012, filed in the Japanese Patent Office Mar. 18, 2008; the entire contents of which is incorporated herein by reference.

BACKGROUND OF THE INVENTION

1. Field of the Invention

The present invention relates to an analog-to-digital (AD) converter applicable to a solid-state image pickup device represented by, for example, a complementary metal-oxide semiconductor (CMOS) image sensor, an AD converting method, a solid-state image pickup device including the AD converter, and a camera system.

2. Description of the Related Art

In recent years, CMOS image sensors have been drawing attention as solid-state image pickup devices (image sensors), in place of charge-coupled device (CCD) image sensors.

This is because CMOS image sensors overcome the problems of CCD image sensors, including that a dedicated manufacturing process is necessary for fabricating CCD pixels, a plurality of power supply voltages are necessary for the operation of a CCD image sensor, and a system including the CCD image sensor becomes very complicated due to the necessity of operating a plurality of peripheral integrated circuits (ICs) in a combined manner.

CMOS image sensors can be manufactured using a process similar to the process of manufacturing general CMOS ICs. Also, a CMOS image sensor can be driven by a single power supply. Furthermore, an analog circuit and a logic circuit using CMOS processes can be mixed in a single chip, resulting in a reduction of the number of peripheral ICs. That is, CMOS sensors have great advantages.

An output circuit of a CCD image sensor is generally a 1-channel (ch) output using a floating diffusion (FD) amplifier with an FD.

In contrast, a CMOS image sensor has an FD amplifier in each pixel and generally uses a column-parallel output scheme that selects a row from an array of pixels and simultaneously outputs signals read from the selected row of pixels in a column direction.

Because it is difficult to obtain sufficient drive power using the FD amplifiers arranged in the pixels, the date rate is necessary to be dropped. In this regard, parallel processing is considered to be advantageous.

A general CMOS image sensor will now be described below.

FIG. 1 shows an example of a pixel in a CMOS image sensor, the pixel including four transistors.

A pixel 10 includes, for example, a photodiode 11 serving as a photoelectric transducer. The pixel 10 has four transistors for the photodiode 11, namely, a transfer transistor 12, an amplifying transistor 13, a selecting transistor 14, and a reset transistor 15, which serve as active elements.

The photodiode 11 converts incident light into electric charge (electrons in this example) whose amount is in accordance with the quantity of the incident light.

The transfer transistor 12 is connected between the photodiode 11 and an FD. By supplying a drive signal to a gate (transfer gate) of the transfer transistor 12 through a transfer control line LTx, the electrons obtained by photoelectric conversion using the photodiode 11 are transferred to the FD.

A gate of the amplifying transistor 13 is connected to the FD. The amplifying transistor 13 is connected to a signal line LSGN via the selecting transistor 14 and, together with a constant current source 16 provided outside the pixel 10, constitutes a source follower.

An address signal is supplied to a gate of the selecting transistor 14 through a selection control line LSEL. When the selecting transistor 14 is turned ON, the amplifying transistor 13 amplifies the potential of the FD and outputs a voltage in accordance with the potential to the output (vertical) signal line LSGN. A signal voltage output from the pixel 10 is output through the signal line LSGN to a pixel-signal reading circuit.

The reset transistor 15 is connected between a power supply line LVDD and the FD. By supplying a reset signal to a gate of the reset transistor 15 through a reset control line LRST, the reset transistor 15 resets the potential of the FD to the potential of the power supply line LVDD.

More specifically, when resetting the pixel 10, the transfer transistor 12 is turned ON, thus discharging the electric charge accumulated in the photodiode 11. Next, the transfer transistor 12 is turned OFF, and the photodiode 11 converts an optical signal into electric charge, and accumulates the electric charge.

At the time of reading, the reset transistor 15 is turned ON, thus resetting the FD. Then, the reset transistor 15 is turned OFF, and the voltage of the FD at that point is output via the amplifying transistor 13 and the selecting transistor 14. This output serves as a P-phase output.

Next, the transfer transistor 12 is turned ON, thus transferring the electric charge accumulated in the photodiode 11 to the FD. The voltage of the FD at that point is output via the amplifying transistor 13. This output serves as a D-phase output.

A difference between the D-phase output and the P-phase output serves as an image signal. Accordingly, not only variations in direct current (DC) components of outputs of the pixels, but also FD reset noise can be removed from the image signal.

These operations are performed at the same time for all pixels included in one row since, for example, the gates of the transfer transistor 12, the selecting transistor 14, and the reset transistor 15 are interconnected on a row-by-row basis.

Various types of pixel-signal reading (output) circuits in column-parallel-output CMOS image sensors have been proposed. One of the most advanced types is the type that includes an analog-to-digital converter (hereinafter abbreviated as "ADC") in each column, and that obtains a pixel signal as a digital signal.

CMOS image sensors with such column-parallel ADCs are disclosed in, for example, W. Yang, et al., "An Integrated 800×600 CMOS Image System," ISSCC Digest of Technical Papers, pp. 304-305, February 1999, and in Japanese Unexamined Patent Application Publication No. 2005-278135.

FIG. 2 is a block diagram showing an exemplary structure of a solid-state image pickup device (CMOS image sensor) with column-parallel ADCs.

A solid-state image pickup device 20 includes, as shown in FIG. 2, a pixel section 21 serving as an image pickup section, a vertical scanning circuit 22, a horizontal transfer/scanning circuit 23, a timing control circuit 24, an ADC group 25, a digital-to-analog converter (hereinafter abbreviated as "DAC") 26, an amplifier (sample/hold (S/H)) circuit 27, and a signal processing circuit 28.

The pixel section 21 includes pixels arranged in a matrix. Each pixel includes a photodiode and a built-in amplifier, for example, as shown in FIG. 1.

In the solid-state image pickup device 20, the timing control circuit 24 for generating an internal clock signal, the vertical scanning circuit 22 for controlling row addresses and row scanning, and the horizontal transfer/scanning circuit 23 for controlling column addresses and column scanning are arranged as control circuits for sequentially reading signals from the pixel section 21.

The ADC group 25 includes a plurality of columns of ADCs. Each ADC includes a comparator 25-1 that compares a reference voltage Vslop, which has a ramp waveform obtained by changing a reference voltage generated by the DAC 26 to be a stepped voltage, with a corresponding one of analog signals obtained from pixels in each row through respective vertical signal lines; a counter 25-2 that counts a comparison time; and a latch 25-3 that holds the count result.

The ADC group 25 includes column-parallel ADC blocks, each ADC block having an n-bit digital signal converting function. The ADC blocks are arranged in correspondence with respective vertical signal lines (column lines).

An output of each latch 25-3 is connected to, for example, a 2n-bit-width horizontal transfer line 29.

In correspondence with the horizontal transfer line 29, 2n amplifier circuits 27 and signal processing circuits 28 are arranged (only one amplifier circuit 27 and one signal processing circuit 28 are shown in FIG. 2).

In the ADC group 25, each of the comparators 25-1, which are arranged in respective columns, compares an analog signal read to a corresponding vertical signal line with the reference voltage Vslop (slope waveform that has a certain slope and changes linearly).

On this occasion, the counters 25-2, which are arranged in respective columns, as with the comparators 25-1, are operating. When the potential Vslop having the ramp waveform and a counter value change with a one-to-one correspondence, a potential of the vertical signal line (analog signal) Vsl is converted into a digital signal.

A change in the reference voltage Vslop is for converting a change in voltage into a change in time. By counting that time using a certain cycle (clock), the voltage can be converted into a digital value.

When the analog electric signal Vsl intersects the reference voltage Vslop, the output of the comparator 25-1 is inverted. Inputting of a clock signal to the counter 25-2 is terminated, and accordingly, AD conversion is completed.

After the above-described AD conversion period, the horizontal transfer/scanning circuit 23 inputs data held in the latch 25-3 via the horizontal transfer line 29 and the amplifier circuit 27 to the signal processing circuit 28, thereby generating a two-dimensional image.

In this manner, column-parallel output processing is performed.

Various techniques have been proposed to extend the dynamic range of ADCs.

FIG. 11 in Japanese Unexamined Patent Application Publication No. 2004-147326 discloses, in order to extend the dynamic range of an ADC, the technique in which an adder circuit is provided at a signal input, and, an offset voltage is generated by monitoring a digital output value of the ADC, and the offset voltage is added to a signal.

FIG. 12 in the paper (pp. 196-199) in "2007 INTERNATIONAL IMAGE SENSOR WORKSHOP" discloses the technique of processing a reference signal in order to extend the dynamic range of an ADC.

Also, FIG. 3 in U.S. Pat. No. 6,670,904 shows the technique of using a plurality of reference signals (slope signals).

SUMMARY OF THE INVENTION

The technique disclosed in FIG. 11 in Japanese Unexamined Patent Application Publication No. 2004-147326 checks the input range after AD conversion. In this case, whether an offset voltage has been generated or not is difficult to be determined unless the ADC deviates from the input range once. Therefore, there is a disadvantage that the ADC becomes outside the AD range (overflow) at least once.

In contrast, the technique disclosed in FIG. 12 of the paper (pp. 196-199) in "2007 INTERNATIONAL IMAGE SENSOR WORKSHOP" processes (changes) a reference signal in order to extend the dynamic range of an ADC. With this method, however, it is difficult to improve the precision of AD conversion.

For example, the technique for changing the slope of a reference signal has been proposed. In this case, since it is difficult to make the slope of a P-phase reference signal equivalent to that of a D-phase reference signal, disadvantageously, the precision of correlated double sampling (CDS) is dropped, and accordingly, CDS itself becomes difficult.

The technique disclosed in FIG. 13 in U.S. Pat. No. 6,670,904 uses a plurality of reference signals (slope signals). With this method, each reference signal is generated by a different circuit, resulting in an increase in circuit dimensions. In practice, it is difficult to make each reference signal have the same slope. Therefore, the reference signals have different slopes and are not combined well. Disadvantageously, it is difficult to perform correction at a subsequent stage.

It is desirable to provide an analog-to-digital converter (ADC) that can extend the dynamic range with high precision, without becoming outside the AD range (overflow), and that can increase the speed of conversion processing, an analog-to-digital converting method, a solid-state image pickup device, and a camera system.

According to an embodiment of the present invention, there is provided an analog-to-digital converter that converts an analog input signal into a digital signal, including the following elements: a comparator configured to compare a reference signal with an input signal and, if the input signal matches the reference signal, inverts an output; a counter configured to count a comparison time of the comparator; a control circuit configured to monitor the output of the comparator; a voltage generating circuit configured to generate, if a monitoring result obtained by the control circuit indicates that the output of the comparator is at a predetermined level, a direct current voltage in accordance with the monitoring result; and an analog adder configured to add the voltage generated by the voltage generating circuit to the input signal and supply a sum signal to an input terminal of the comparator.

Preferably, the voltage generated by the voltage generating circuit and the input single are each supplied via a capacitor.

Preferably, the voltage generating circuit can generate a plurality of voltages, and the plurality of voltages are supplied via different capacitors.

Preferably, the analog-to-digital converter further includes a digital-signal correcting circuit configured to calculate an analog-to-digital-converted value using a signal obtained by the control circuit and an output signal of the counter.

Preferably, an initial value of the counter can be set, and the analog-to-digital converter further includes a selecting circuit that can select an arbitrary initial value from among a plurality of initial values of the counter, in accordance with a signal from the control circuit.

Preferably, the counter includes a plurality of flip flops that can perform serial input/output, and the counter can operate in accordance with a counter mode and a shift register mode. In the counter mode, a data output of each of the plurality of flip flops is supplied to a clock input of a flip flop at a next stage, and, if the output of the comparator is at the predetermined level, the counter functions as a counter synchronized with a counter clock signal. In the shift register mode, the plurality of flip flops are cascade-connected, the selected initial value is input to the counter, and the counter functions as a shift register synchronized with a shift register clock signal.

According to another embodiment of the present invention, there is provided an analog-to-digital converting method including the following steps: a first step of comparing an input signal voltage with a reference signal voltage; a second step of monitoring a comparison result, adding a voltage to the input signal voltage if the input signal voltage is less than the reference signal voltage, and storing a counter value corresponding to the added voltage in a memory; a third step of repeating the first and second steps until a total voltage of the input signal voltage and the added voltage becomes greater than or equal to the reference signal voltage, and holding the total voltage at the time the total voltage of the input signal voltage and the added voltage becomes greater than or equal to the reference signal voltage; a fourth step of setting the counter value stored in the memory as an initial value in the counter; and a fifth step of comparing the held total voltage with the reference signal voltage.

Preferably, the analog-to-digital converting method further includes a sixth step of adding a counter value obtained by counting to the counter value stored in the memory, and outputting a sum counter value.

Preferably, the analog-to-digital converting method further includes a sixth step of outputting a counter value obtained by counting, and outputting the counter value stored in the memory; and a seventh step of combining the counter values output in the sixth step using a logic circuit at a subsequent stage.

According to another embodiment of the present invention, there is provided a solid-state image pickup device including the following elements: a pixel section including a plurality of pixels arranged in a matrix, the plurality of pixels performing photoelectric conversion; and a pixel-signal reading circuit configured to read pixel signals from the pixel section in increments of multiple pixels. The pixel-signal reading circuit includes the following elements: a plurality of comparators arranged in correspondence with respective columns of the matrix of the plurality of pixels, each of the plurality of comparators comparing a voltage of a read signal input to the comparator with a voltage of a reference signal, and, if the voltage of the input signal matches the voltage of the reference signal, inverting an output; and a plurality of control units whose operation is controlled in accordance with the outputs of the plurality of comparators, respectively, each of the plurality of control units including a counter configured to count a comparison time of a corresponding one of the plurality of comparators. Each of the plurality of control units includes the following elements: the counter configured to count the comparison time of the comparator; a control circuit configured to monitor the output of the comparator; a voltage generating circuit configured to generate, if a monitoring result obtained by the control circuit indicates that the output of the comparator is at a predetermined level, a direct current voltage in accordance with the monitoring result; and an analog adder configured to add the voltage generated by the voltage generating circuit to the input signal and supply a sum signal to an input terminal of the comparator.

According to another embodiment of the present invention, there is provided a camera system including the following elements: a solid-state image pickup device; and an optical system that forms an optical image of a subject on the solid-state image pickup device. The solid-state image pickup device includes the following elements: a pixel section including a plurality of pixels arranged in a matrix, the plurality of pixels performing photoelectric conversion; and a pixel-signal reading circuit configured to read pixel signals from the pixel section in increments of multiple pixels. The pixel-signal reading circuit includes the following elements: a plurality of comparators arranged in correspondence with respective columns of the matrix of the plurality of pixels, each of the plurality of comparators comparing a voltage of a read signal input to the comparator with a voltage of a reference signal, and, if the voltage of the input signal matches the voltage of the reference signal, inverting an output; and a plurality of control units whose operation is controlled in accordance with the outputs of the plurality of comparators, respectively, each of the plurality of control units including a counter configured to count a comparison time of a corresponding one of the plurality of comparators. Each of the plurality of control units includes the following elements: the counter configured to count the comparison time of the comparator; a control circuit configured to monitor the output of the comparator; a voltage generating circuit configured to generate, if a monitoring result obtained by the control circuit indicates that the output of the comparator is at a predetermined level, a direct current voltage in accordance with the monitoring result; and an analog adder configured to add the voltage generated by the voltage generating circuit to the input signal and supply a sum signal to an input terminal of the comparator.

According to the embodiments of the present invention, the dynamic range can be extended with high precision, without the ADC becoming outside the AD range (overflow), and the speed of conversion processing can be increased.

DESCRIPTION OF THE PREFERRED EMBODIMENTS

Embodiments of the present invention will now herein be described below with reference to the drawings.

Figure 3:
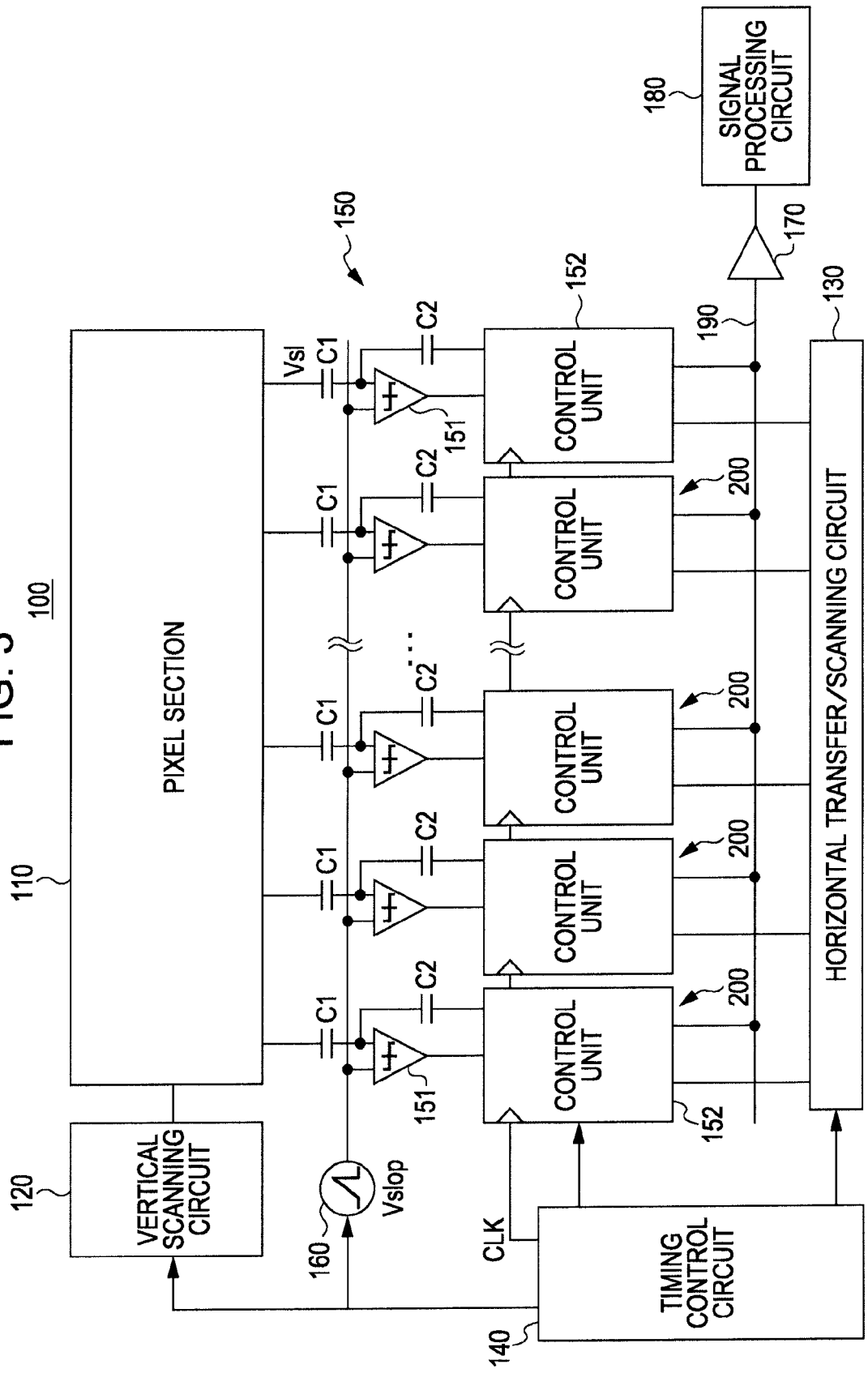
FIG. 3 is a block diagram showing an exemplary structure of a solid-state image pickup device (CMOS image sensor) with column-parallel ADCs according to an embodiment of the present invention.

FIG. 3 is a block diagram showing an exemplary structure of a solid-state image pickup device (CMOS image sensor) with column-parallel ADCs according to an embodiment of the present invention.

A solid-state image pickup device 100 includes, as shown in FIG. 3, a pixel section 110 serving as an image pickup section, a vertical scanning circuit 120, a horizontal transfer/scanning circuit 130, a timing control circuit 140, an ADC group 150 serving as a pixel-signal reading circuit, a DAC 160, an amplifier (S/H) circuit 170, a signal processing circuit 180, and a horizontal transfer line 190. In the ADC group 150, a plurality of ADCs 200 are arranged in parallel.

Figure 1:
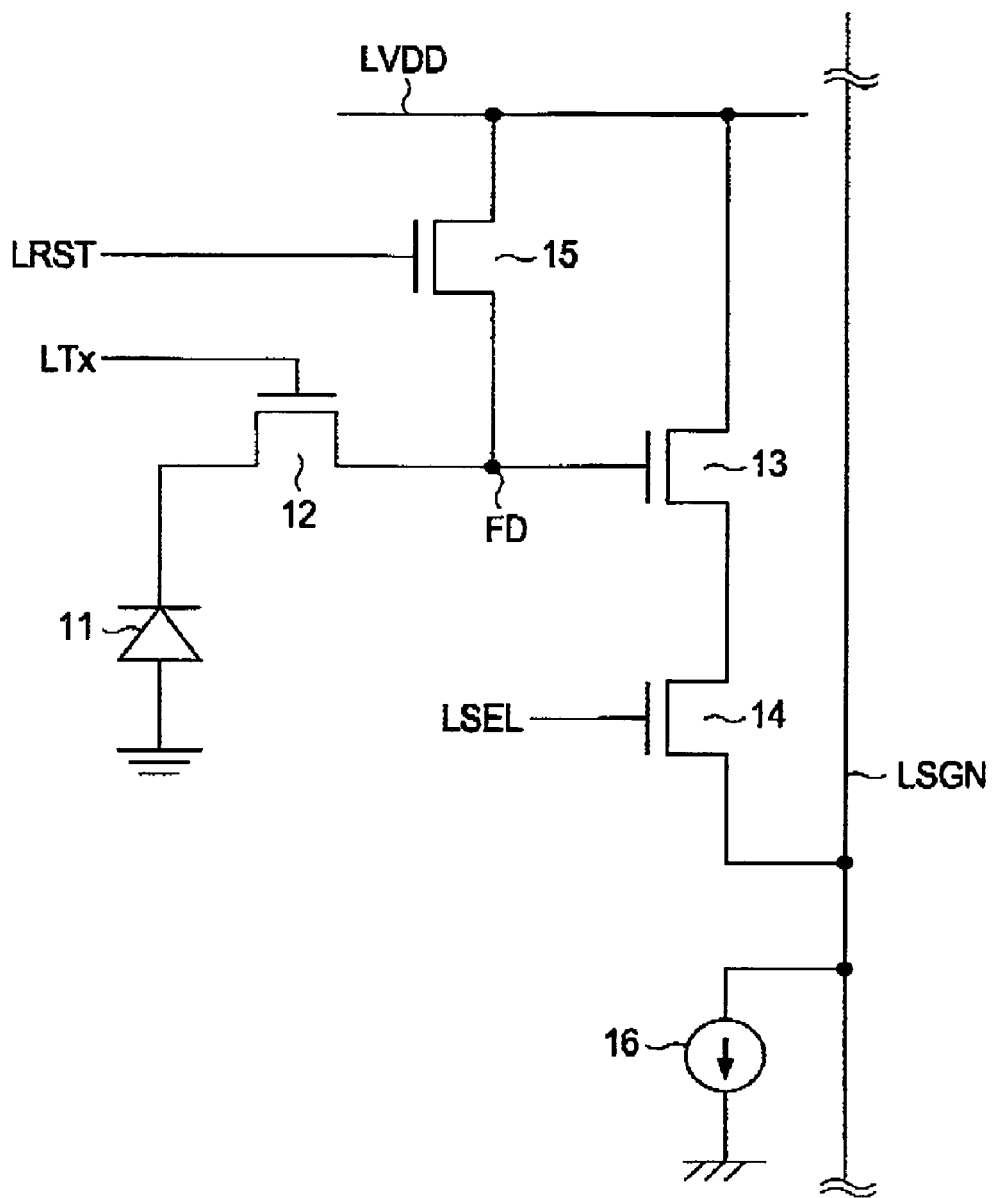
FIG. 1 is a diagram showing an example of a pixel in a CMOS image sensor, the pixel including four transistors.
Figure 2:
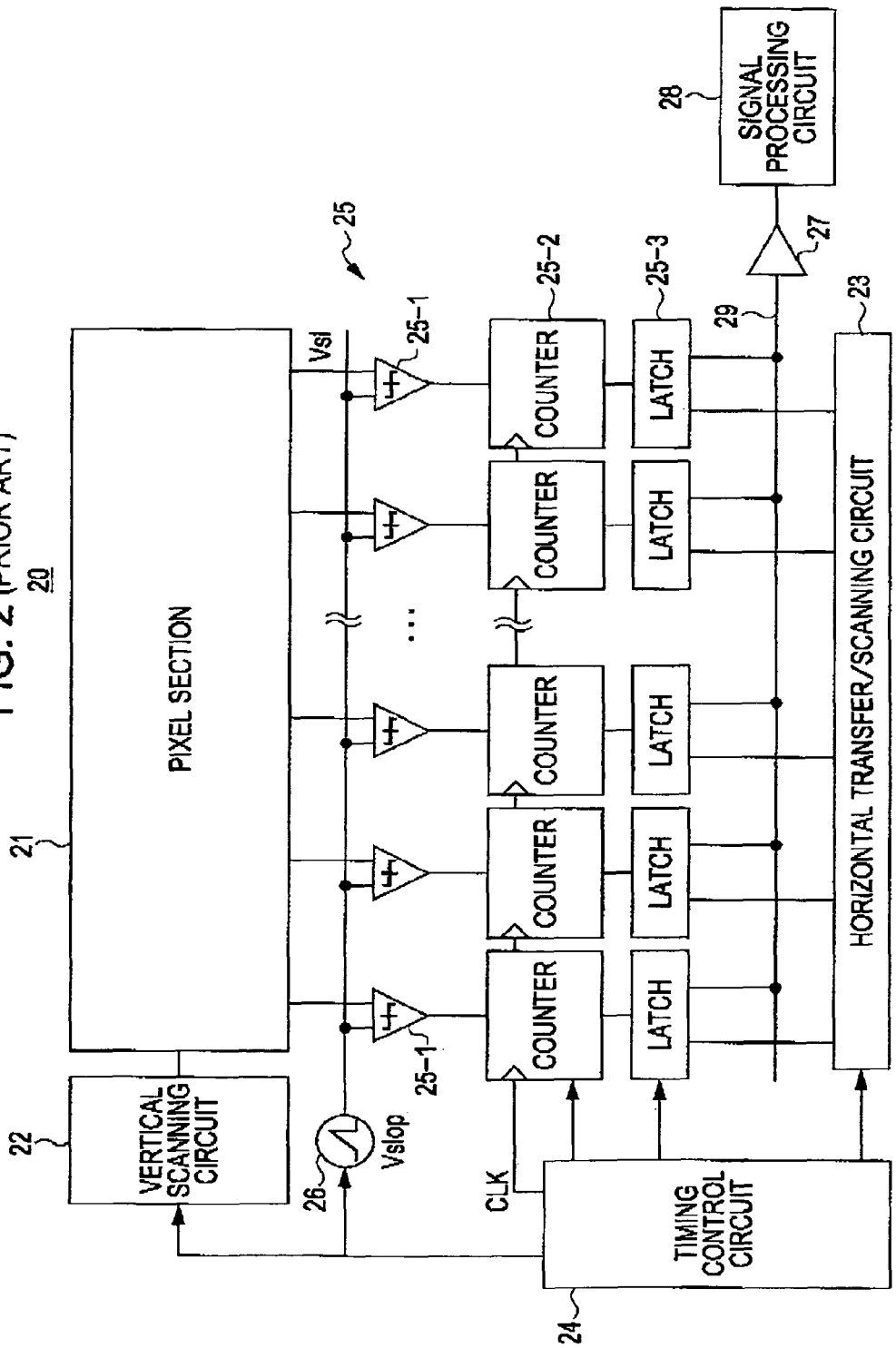
FIG. 2 is a block diagram showing an exemplary structure of a solid-state image pickup device (CMOS image sensor) with column-parallel ADCs.

The pixel section 110 includes pixels arranged in a matrix. Each pixel includes a photodiode and a built-in amplifier, for example, as shown in FIG. 1.

In the solid-state image pickup device 100, the timing control circuit 140 for generating an internal clock signal, the vertical scanning circuit 120 for controlling row addresses and row scanning, and the horizontal transfer/scanning circuit 130 for controlling column addresses and column scanning are arranged as control circuits for sequentially reading signals from the pixel section 110.

The ADC group 150 basically includes a plurality of columns of the ADCs 200. Each ADC 200 includes a comparator 151 that compares a reference voltage Vslop, which has a ramp waveform obtained by changing a reference voltage generated by the DAC 160 to be a stepped voltage, with a corresponding one of analog signals (potential Vsl) obtained from pixels in each row through respective vertical signal lines; and a control unit 152 that includes a counter that counts a comparison time. The control unit 152 monitors the output of the comparator 151 and generates a DC voltage in accordance with the monitoring result. The control unit 152 performs analog addition of the generated DC voltage and the input analog signal, and supplies the sum signal to an analog-signal input terminal of the comparator 151.

The ADC group 150 includes column-parallel ADC blocks, each ADC block having an n-bit digital signal converting function. The ADC blocks are arranged in correspondence with respective vertical signal lines (column lines).

An output of each latch is connected to, for example, the 2n-bit-width horizontal transfer line 190.

In correspondence with the horizontal transfer line 190, 2n amplifier circuits 170 and signal processing circuits 180 are arranged (only one amplifier circuit 170 and one signal processing circuit 180 are shown in FIG. 3).

In the ADC group 150, each of the comparators 151, which are arranged in respective columns, compares an analog pixel signal Vsig (potential Vsl) read to a corresponding vertical signal line with the reference voltage Vslop (slope waveform or ramp waveform that has a certain slope and changes linearly.

On this occasion, the counters, which are arranged in respective columns, as with the comparators 151, are operating. When the potential Vslop having the ramp waveform and a counter value change with a one-to-one correspondence, a potential of the vertical signal line (analog signal) Vsl is converted into a digital signal.

A change in the reference voltage Vslop is for converting a change in voltage into a change in time. By counting that time using a certain cycle (clock), the voltage can be converted into a digital value.

When the analog electric signal Vsl intersects the reference voltage Vslop, the output of the comparator 151 is inverted. Inputting of a clock signal to the counter is terminated, or inputting of a clock signal to the counter, which has been terminated, is resumed. Accordingly, AD conversion is completed.

After the above-described AD conversion period, the horizontal transfer/scanning circuit 130 inputs data held in the latch via the horizontal transfer line 190 and the amplifier circuit 170 to the signal processing circuit 180, thereby generating a two-dimensional image by performing predetermined signal processing.

Hereinafter, the structure, functions, and the like of each ADC in the ADC group (pixel-signal reading circuit) 150 with a characteristic structure of the embodiment will be described in detail.

First Embodiment

Figure 4:
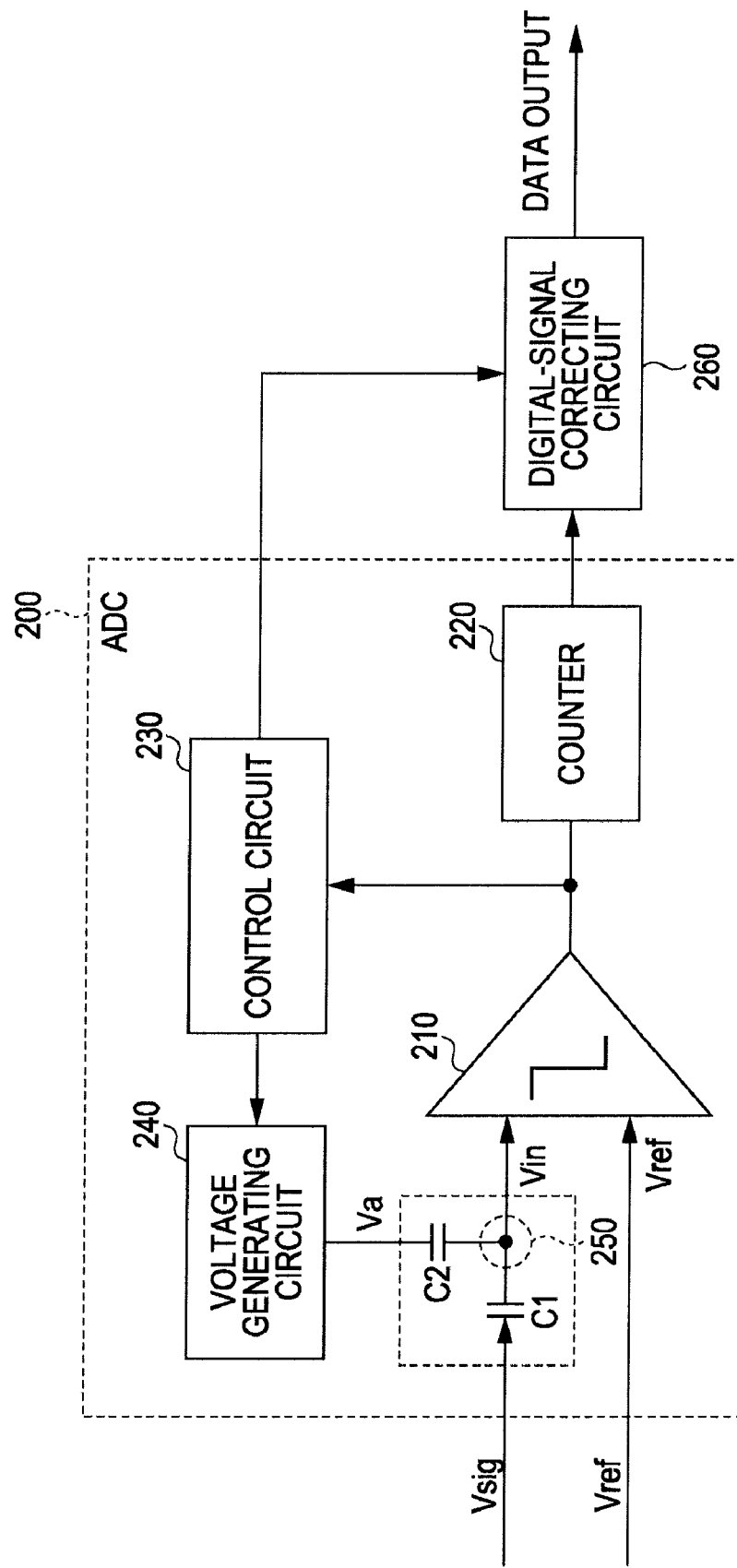
FIG. 4 is a block diagram showing an exemplary structure of an ADC according to a first embodiment.

FIG. 4 is a block diagram showing an exemplary structure of an ADC according to a first embodiment.

Referring to FIG. 4, the ADC 200 is shown. Also, the comparator 151 shown in FIG. 3 is denoted by reference numeral 210.

The ADC 200 shown in FIG. 4 includes the comparator 210 (151), a counter 220 that counts a comparison time of the comparator 210, a control circuit 230 that monitors an output of the comparator 210, a voltage generating circuit 240 that generates a DC voltage in accordance with the monitoring result obtained by the control circuit 230, a capacitor C1 connected to an analog-signal (Vsig) input terminal of the comparator 210, a capacitor C2 connected to an output side of the voltage generating circuit 240, an analog adder 250 that adds an analog signal Vsig via the capacitor C1 and a DC signal via the capacitor C2, and a digital-signal correcting circuit 260.

In the structure shown in FIG. 4, the analog adder 250 is a wired-OR gate.

The comparator 210 compares a reference wave Vref with a pixel signal Vsig. For example, when the pixel signal Vsig reaches the level of the reference wave Vref, that is, when the pixel signal Vsig intersects the reference wave Vref, the comparator 210 switches its output level from low level to high level.

The digital-signal correcting circuit 260 has a function of calculating an AD-converted value using a signal S230 of the control circuit 230 and a signal S220 of the counter 220.

Figure 5:
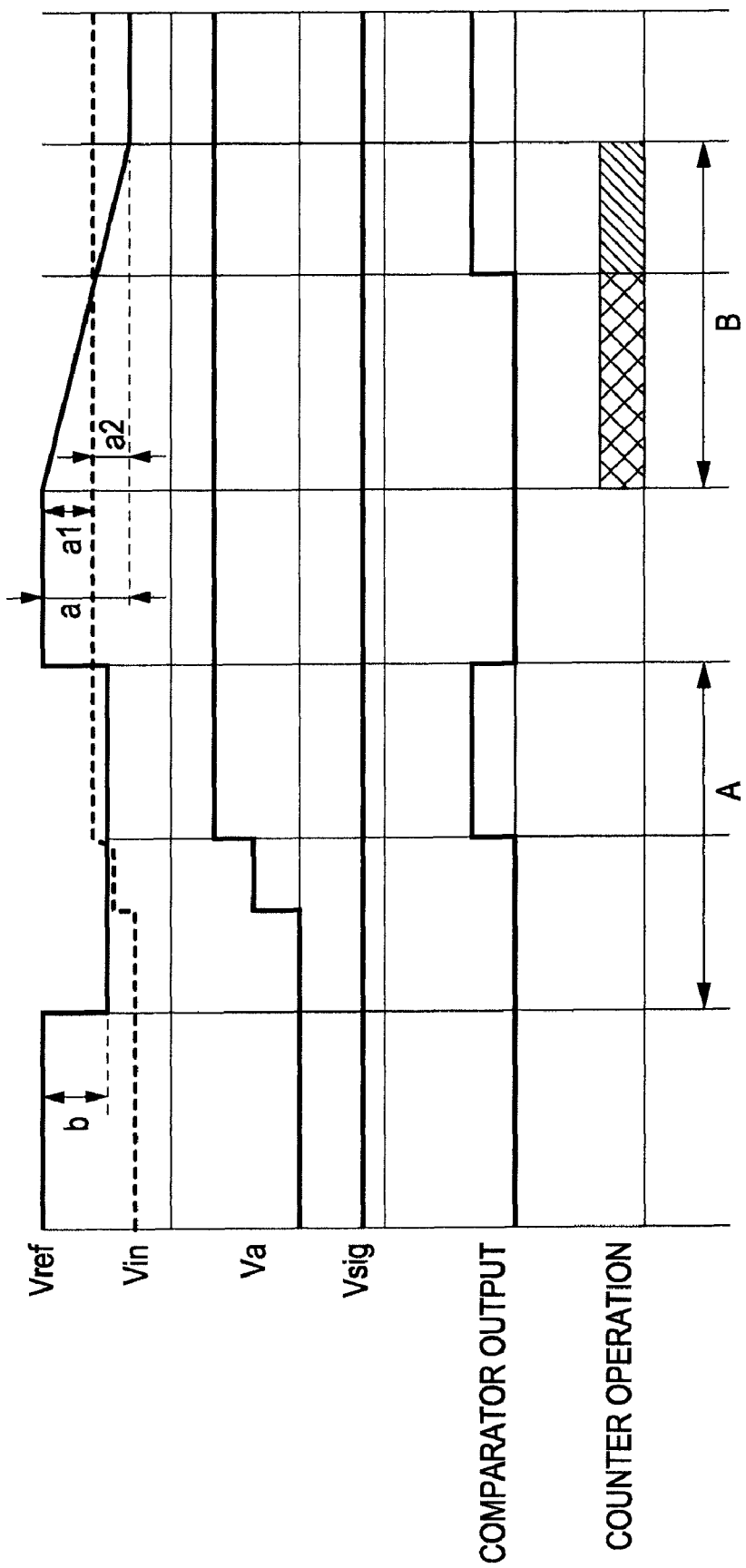
FIG. 5 is a timing chart for illustrating the operation of the ADC shown in FIG. 4.

FIG. 5 is a timing chart for illustrating the operation of the ADC shown in FIG. 4.

Hereinafter, the operation of the ADC shown in FIG. 4 will be described with reference to FIG. 5.

Operation

In a period A, the reference wave Vref is set to a fixed voltage.

On this occasion, if the output of the comparator 210 is 0 V (low level), the control circuit 230 generates a fixed voltage Va using the voltage generating circuit 240. With the capacitors C1 and C2, the input voltage of the comparator 210 changes in the following manner:

$$\Delta V\text{in} = C2/(C1+C2) * Va \quad (1)$$

By repeating this until the output of the comparator 210 is inverted to high level, the input range of the ADC 200 is changed.

Next, in a period B, a stepped reference voltage Vref is generated, and a count operation is performed, thereby performing AD conversion.

Next, counter value information corresponding to the amount of change ΔVin of the input voltage Vin of the comparator 210 (b in FIG. 5) is sent as the signal S230 from the control circuit 230 to the digital-signal correcting circuit 260.

On the basis of the output of the counter 220 and the counter value corresponding to ΔVin, the digital-signal correcting circuit 260 corrects the counter value and outputs the corrected counter value data.

The structure and the functions of the digital-signal correcting circuit 260 shown in FIG. 4 may be those of a general digital-signal correcting circuit.

Also, a and b shown in FIG. 4 are set so that a is greater than b, that is, b<a (=a1+a2).

Although the period A and the period B have substantially the same lengths in FIG. 5 for the convenience of the description, the period A is actually much shorter than the period B.

By performing the foregoing operation, the AD conversion time in the period B can be reduced. Therefore, the total time of the period A and the period B can be made shorter than the time taken to perform AD conversion.

For example, when a1=a2=1/2a, the period B can be reduced to half of that in general AD conversion. Even when the period A is added to the period B, the total time of the period A and the period B is shorter than that in the general case.

As has been described above, when this ADC 200 is applied to a column-ADC solid-state image pickup device, an output signal from a pixel is input as the input signal Vsig shown in FIG. 4 to the comparator 210 (151), and a signal generated by the DAC 160 is input as the reference signal Vref shown in FIG. 4 to the comparator 210 (151). Also, a data output shown in FIG. 4 is input to the amplifier circuit 170 of the solid-state image pickup device.

In this case, the reference signal Vref is common on a column-by-column basis.

Furthermore, the digital-signal correcting circuit 260 may be directly connected to the ADC 200, as shown in FIG. 4, or may be provided in a digital signal processor (DSP) at a subsequent stage.

Also, the digital-signal correcting circuit 260 can perform signal processing peculiar to the solid-state image pickup device, such as gamma correction, despite whether the digital-signal correcting circuit 260 is connected to the ADC 200 as shown in FIG. 4 or is provided in a DSP at a subsequent stage. In such a case, there is an advantage that linearity compensation is unnecessary in the solid-state image pickup device.

Next, specific exemplary structures of an ADC according to the first embodiment will now be described.

Figure 6:
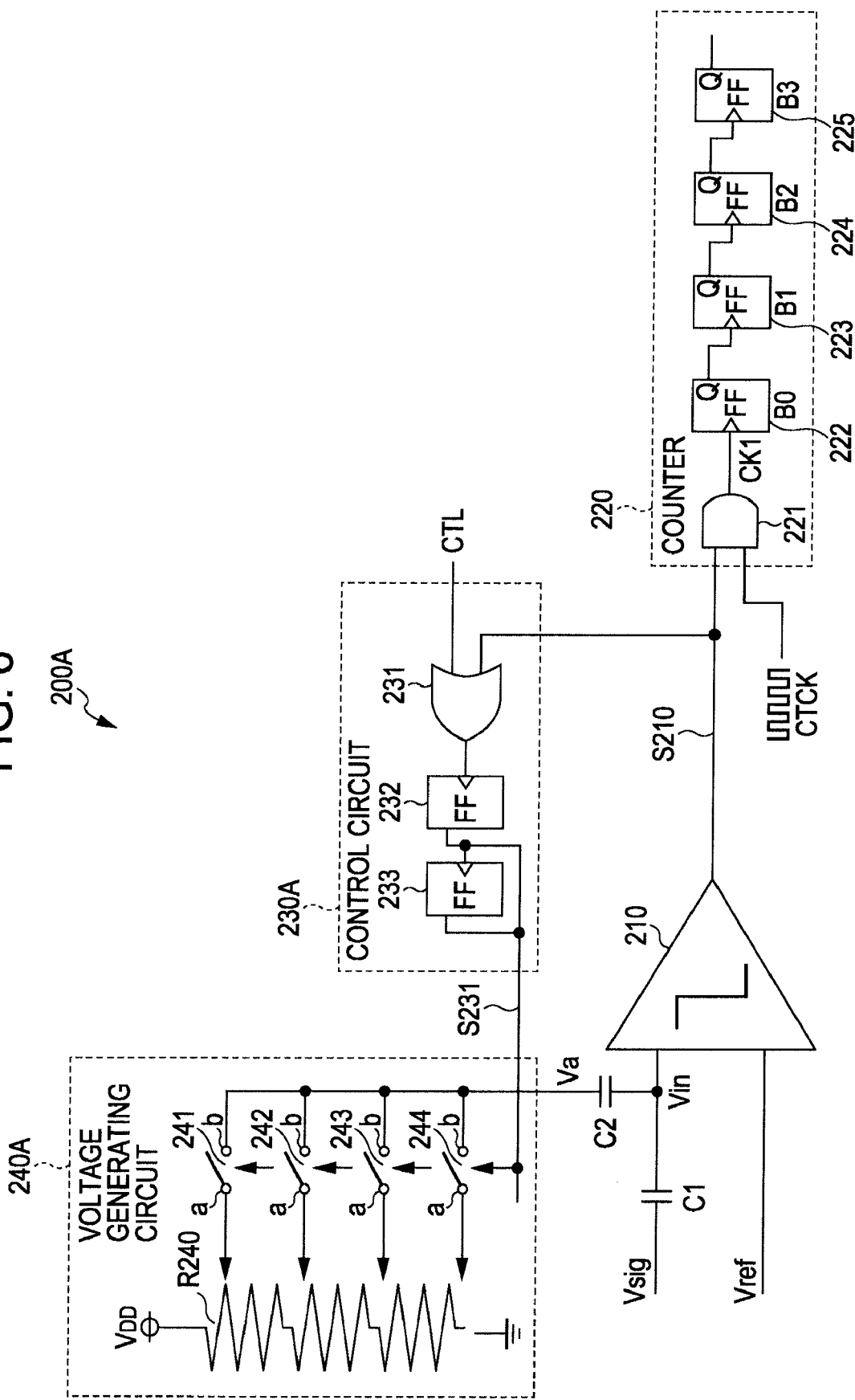
FIG. 6 is a circuit diagram showing a first exemplary structure of the ADC according to the first embodiment.

FIG. 6 is a circuit diagram showing a first exemplary structure of the ADC according to the first embodiment (ADC shown in FIG. 6 will be called an "ADC 200A" hereinafter).

Referring to FIG. 6, the counter 220 includes a 2-input AND gate 221 and a plurality of (four in the example shown in FIG. 6) flip flops 222 to 225.

An output S210 of the comparator 210 is input to one input of the AND gate 221, and a counter clock signal CTCK is input to the other input of the AND gate 221.

An output of the AND gate 221 is connected to a clock input CK of the flip flop 221 at the first stage. A data output Q of the flip flop 222 is connected to a clock input CK of the flip flop 223 at the next stage. A data output Q of the flip flop 223 is connected to a clock input CK of the flip flop 224 at the next stage. A data output Q of the flip flop 224 is connected to a clock input CK of the flip flop 225 at the final stage.

A control circuit 230A includes a 2-input OR gate 231, and flip flops 232 and 233 forming a shift register.

The output S210 of the comparator 210 is input to one input of the OR gate 231, and a control signal CTL is input to the other input of the OR gate 231.

An output of the OR gate 231 is connected to a clock input CK of the flip flop 232. A data output Q of the flip flop 232 is connected to a clock input CK of the flip flop 233.

Data outputs Q of the flip flops 232 and 233 are wired-ORed to generate a signal S231, which is supplied to a voltage generating circuit 240A.

The voltage generating circuit 240A includes a resistance element R240 connected between a power supply potential VDD and a reference potential Vss, and switches 241 to 244 whose terminals a are connected to a plurality of (four in the example shown in FIG. 6) taps of the resistance element R240 and terminals b are commonly connected to the capacitor C2.

The switches 241 to 244 are selectively turned ON/OFF in response to the output signal 231 output from the shift register in the control circuit 230A. As a result, a voltage Va obtained by performing resistive division using the resistance element R240 is supplied via the capacitor C2 to the analog-signal input terminal of the comparator 210.

Figure 7:
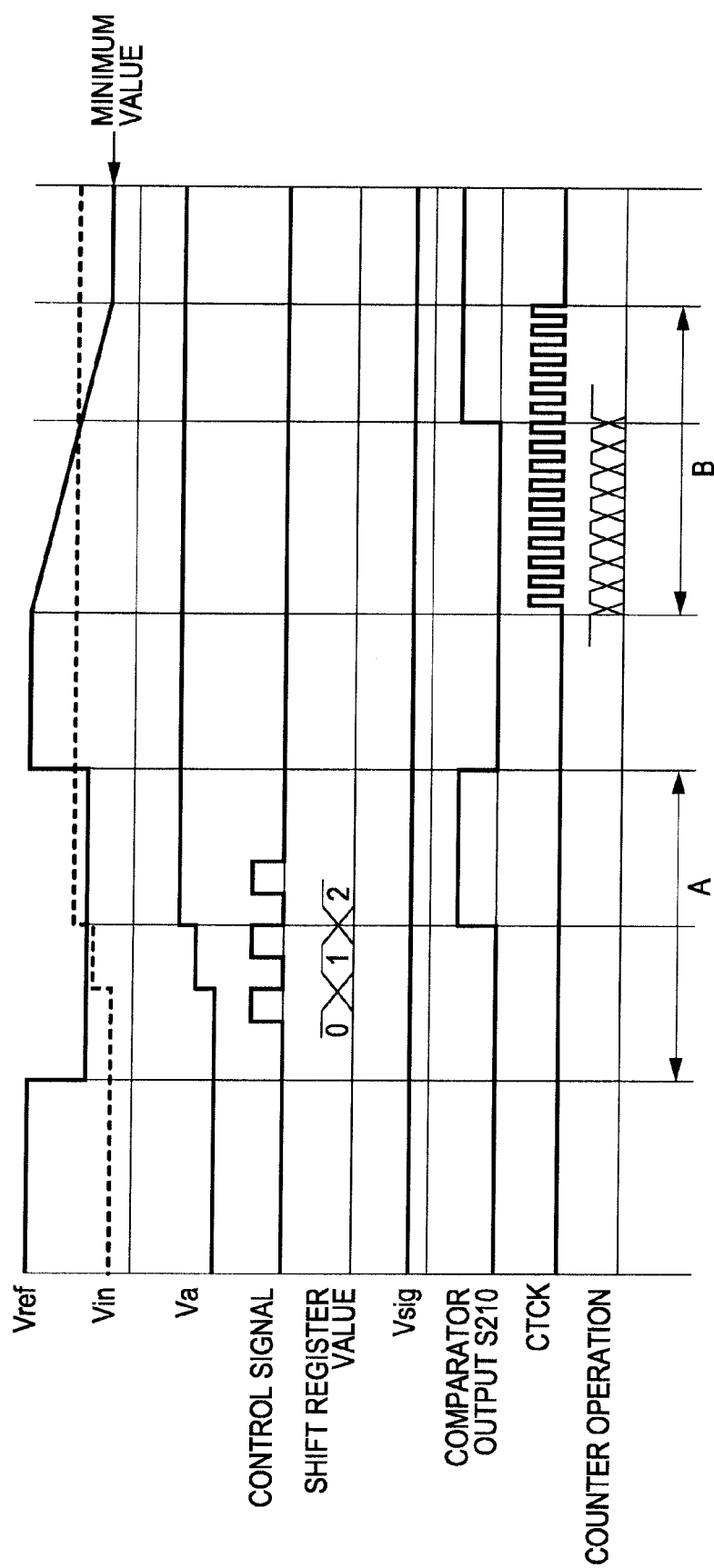
FIG. 7 is a timing chart for illustrating the operation of the ADC shown in FIG. 6.

FIG. 7 is a timing chart for illustrating the operation of the ADC shown in FIG. 6.

Hereinafter, the operation of the ADC shown in FIG. 6 will be described with reference to FIG. 7.

At the point at which a signal voltage Vsig is input, a reference voltage Vref is fixed to the minimum value.

A control signal (clock signal) CTL is input to the OR gate 231 of the control circuit 230. When the input signal Vsig is greater than or equal to the minimum value of the reference voltage Vref, the comparator 210 outputs a signal S210 at high level. Therefore, the shift register in the control circuit 230 is not activated.

In contrast, when the input signal Vsig is less than the minimum value of the reference voltage Vref, the comparator 210 outputs a signal S210 at low level. Therefore, the shift register in the control circuit 230 is activated, and, in accordance with the output signal S231 of the shift register, the switches 241 to 244 in the voltage generating circuit 240A are turned ON. As a result, a voltage Va is generated, and an input potential Vin of the comparator 210 changes, as shown in FIG. 7.

This operation is repeated, and, at the point at which the output of the comparator 210 reaches a high level, the control circuit 230A stops operating, and the voltage Va stops changing.

Next, the reference voltage Vref is set to a start voltage. The reference wave Vref is changed to be a stepped voltage, and the counter 220 performs a count operation using a counter clock signal CTCK, thereby performing AD conversion.

An internal value of the counter 220 and a value of the shift register in the control circuit 230A are read and combined together to generate a precise AD-converted value of the input signal Vsig.

Note that the voltage Va is not necessarily to be equally stepped; the voltage Va may be stepped in any manner as long as a counter value corresponding to each step can be recognized.

When this ADC 200A is applied to a column-ADC solid-state image pickup device, if a reference wave that is common to all columns is input to all columns, the minimum value is set to a common value in all columns.

According to this embodiment, the dynamic range of the ADC can be extended.

When a reference wave for AD conversion is to be processed so as to change the slope of a ramp wave (change the gain), the P-phase and the D-phase are necessary to have the same slope, which is difficult to accomplish. It thus becomes difficult to perform highly precise AD conversion.

In contrast, in this embodiment, the reference wave Vref is not necessary to be processed. Therefore, the foregoing problem does not occur, and accordingly, highly precise AD conversion can be performed.

When a plurality of ramp waves are used (double-slope), the ramp waves are generated by different circuits. It is thus difficult to make the slopes of the ramp waves equal, and accordingly, it is difficult to combine these ramp waves well and perform precise AD conversion.

In contrast, in this embodiment, the counting in the period A and the counting in the period B can be easily combined by simple addition. Therefore, precise AD conversion can be performed.

In the case of a method of changing the slope of a ramp wave, besides addition and subtraction, multiplication is also necessary, which involves large circuitry.

In contrast, in this embodiment, only addition and subtraction are necessary, which can be performed using small circuitry. In the case of a method using a plurality of ramp waves, since the ramp waves are generated using different circuits, large circuitry is necessary. However, in this embodiment, this problem does not occur. That is, according to this embodiment, an increase in size of the circuitry can be suppressed.

When a general reference signal (slope) is used, if an input signal is outside the range of the first reference signal, the second, third, . . . reference signals (corresponding to the period B) are necessary to be generated in succession to the first reference signal. It is necessary to compare the input signal with a different reference signal until the input signal becomes within the range of the reference signal. Therefore, it takes a long time to perform AD conversion.

In contrast, according to this embodiment, the time of the period A is shorter than the time of the period B. Unlike the foregoing general case where the period B is repeated, this embodiment where there is only one period B is advantageous in that the time taken to perform AD conversion can be reduced.

Furthermore, the related art has difficulty in determining generation of an offset voltage unless an ADC becomes outside the input range once. Therefore, there is a problem that the ADC becomes outside the AD range (overflow) at least once.

In contrast, according to this embodiment, an offset voltage is added to an analog input signal. Therefore, the dynamic range can be extended without giving rise to overflow, and the precision of AD conversion can be improved.

In the techniques using a plurality of reference signals (slope signals), the reference signals have different slopes and are not combined well. As a result, the precision of AD conversion is dropped.

In contrast, in this embodiment, the dynamic range can be extended without giving rise to the foregoing problem, and the precision of AD conversion can be improved.

That is, according to this embodiment, both the speed and the precision of AD conversion can be improved at the same time.

In addition, according to this embodiment, the amplitude of a DAC for generating a reference signal can be made small, and the input range of AD conversion can be made lower. Therefore, the power consumption of the ADC and the DAC can be reduced.

Furthermore, the method of changing a reference signal has difficulty in improving the precision of AD conversion. However, according to this embodiment, the precision of AD conversion can be improved.

Figure 8:
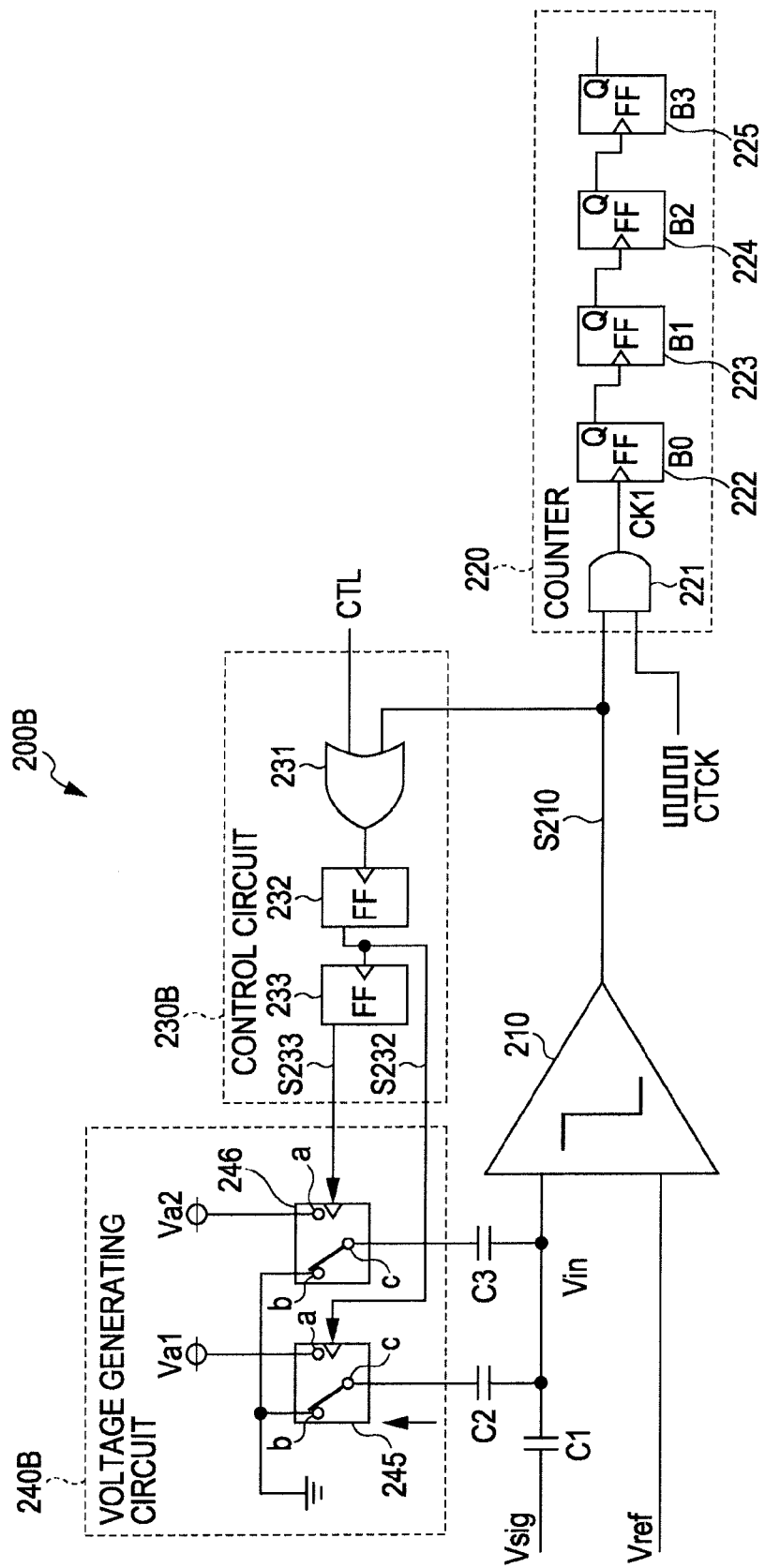
FIG. 8 is a circuit diagram showing a second exemplary structure of the ADC according to the first embodiment.

FIG. 8 is a circuit diagram showing a second exemplary structure of the ADC according to the first embodiment.

An ADC 200B shown in FIG. 8 differs from the ADC 200A shown in FIG. 6 in the following points. A shift register is used in a control circuit 230B, and the flip flops 232 and 233 output control signals S232 and S233, respectively. In a voltage generating circuit 240B, a plurality of (two in the example shown in FIG. 8) DC signals Va1 and Va2 are connected to the analog-signal input terminal of the comparator 210 via a plurality of capacitors C2 and C3, respectively.

The voltage generating circuit 240B includes switch circuits 245 and 246.

The switch circuit 245 has a terminal a connected to a power supply potential Va1, a terminal b connected to a reference potential Vss, and a terminal c connected to the capacitor C2. The switch circuit 245 switches between connection of the terminal c with the terminal a and connection of the terminal c with the terminal b in accordance with the control signal S232 from the control circuit 230B.

The switch circuit 246 has a terminal a connected to a power supply potential Va2, a terminal b connected to the reference potential Vss, and a terminal c connected to the capacitor C3. The switch circuit 246 switches between connection of the terminal c with the terminal a and connection of the terminal c with the terminal b in accordance with the control signal S233 from the control circuit 230B.

In the example shown in FIG. 8, the amount of change in a signal input to the comparator 210 is as follows:

$$\Delta Vin = (C2/(C1+C2+C3)) * Va1 + (C3/(C1+C2+C3)) * Va2 \tag{2}$$

By setting an appropriate voltage ratio or a capacitance ratio, the input voltage Vin of the comparator 210 can be adjusted. For example, if C2=C3 and Va1=2*Va2, the amount of change in the input voltage Vin can be obtained as follows:

$$\Delta Vin = (C2/(C1+2*C2)) * Va1 + (C2/(C1+2*C2)) * Va2 \tag{3}$$

Therefore, the input voltage Vin can be changed in equal steps by combining the control signals S232 and S233 of the shift register in the control circuit 230B.

In the example shown in FIG. 8, the voltage generating circuit 240B, which has two power systems, can add voltages at four levels: both Va1 and Va2 are OFF; Va1 is ON and Va2 is OFF; Va1 is OFF and Va2 is ON; and both Va1 and Va2 are ON. That is, the voltage generating circuit 240B can perform 2-bit voltage addition.

The second exemplary structure has advantages similar to those of the above-described first exemplary structure.

Second Embodiment

Figure 9:
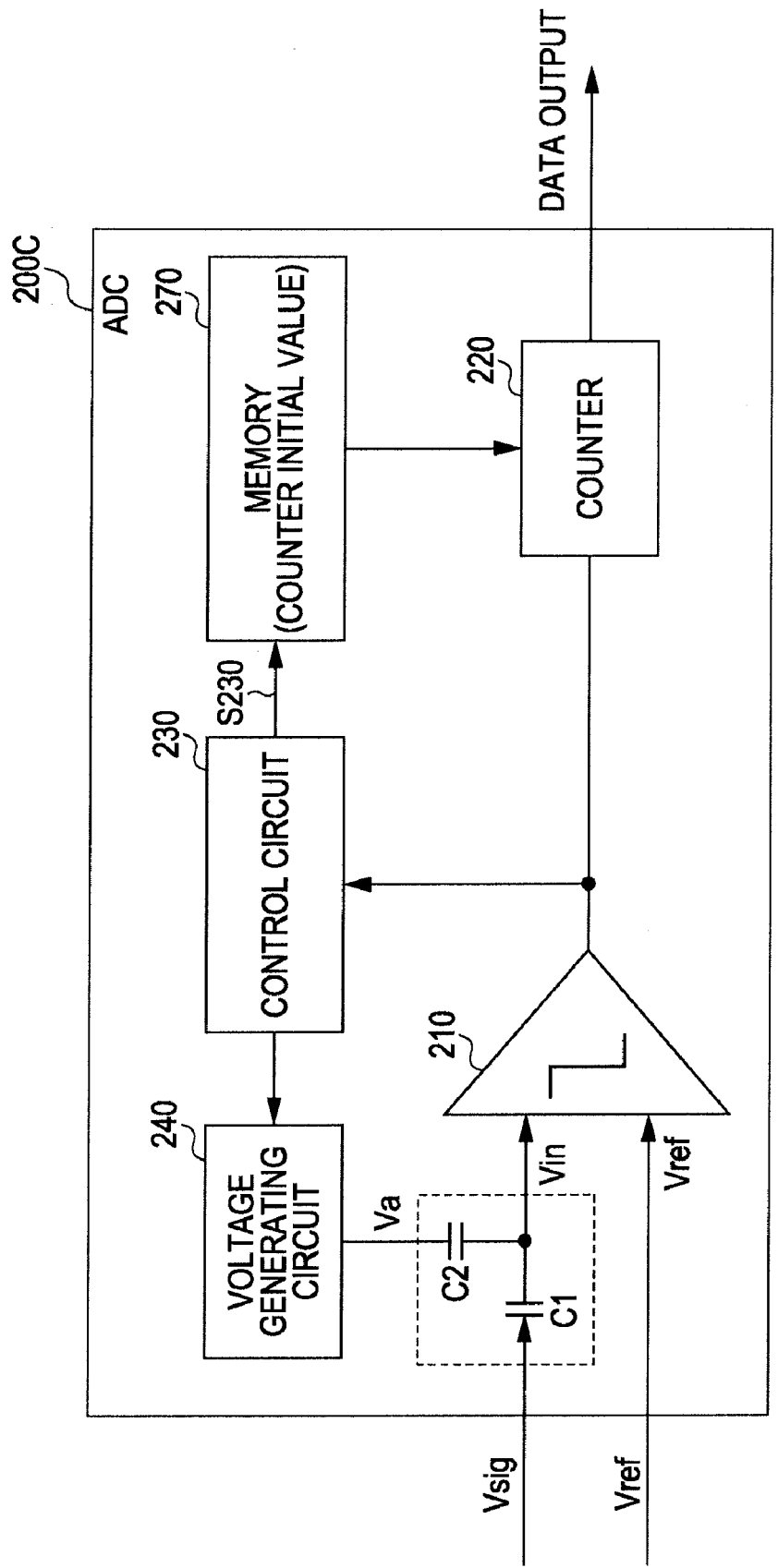
FIG. 9 is a block diagram showing an exemplary structure of an ADC according to a second embodiment.

FIG. 9 is a block diagram showing an exemplary structure of an ADC according to a second embodiment.

An ADC 200C according to the second embodiment includes, besides the structure of the ADC 200 according to the first embodiment, which is shown in FIG. 4, a memory 270 whose initial value can be set. In accordance with a signal S230 from the control circuit 230, different initial values of the counter 220 can be selected.

Figure 10:
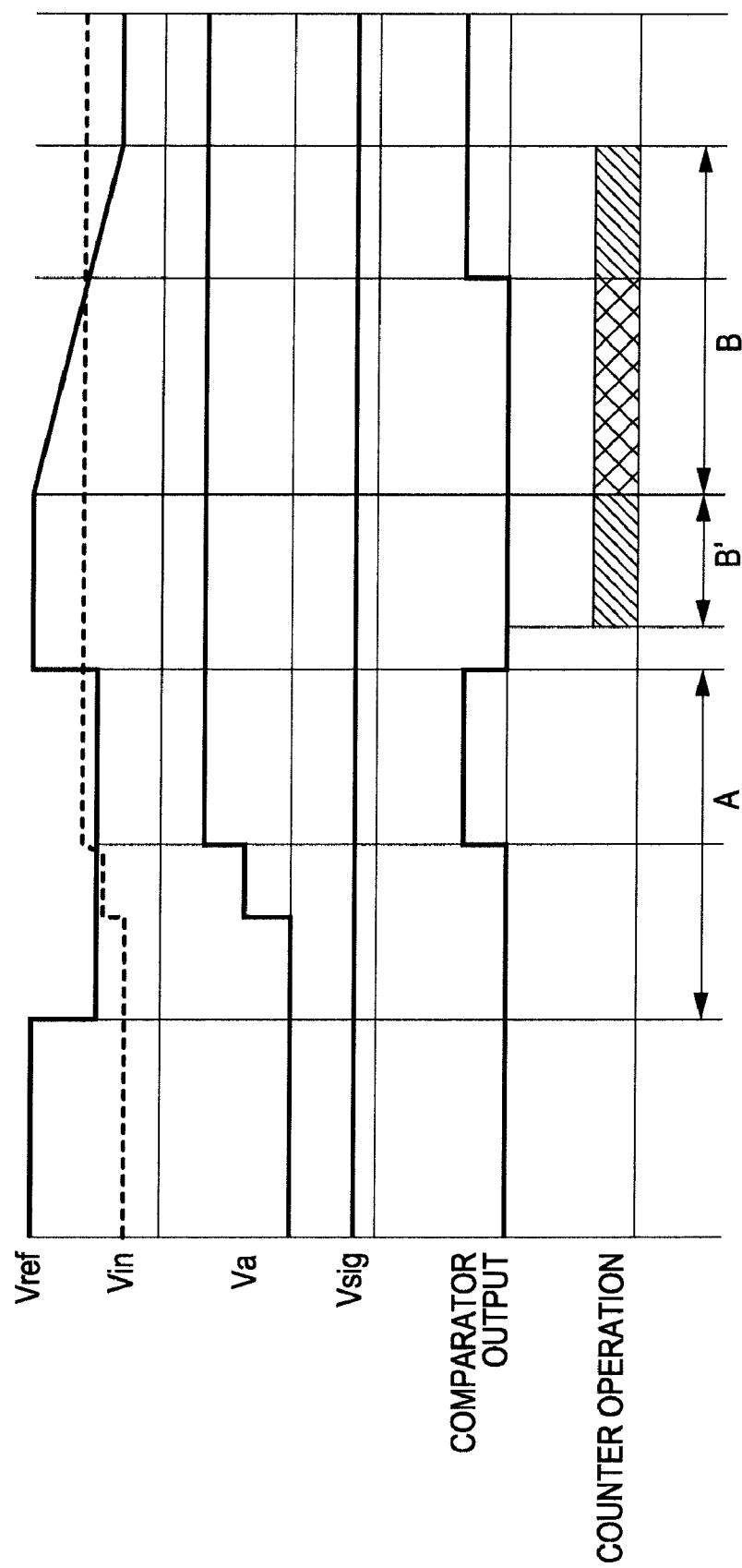
FIG. 10 is a timing chart for illustrating the operation of the ADC shown in FIG. 9.

FIG. 10 is a timing chart for illustrating the operation of the ADC shown in FIG. 9.

Hereinafter, the operation of the ADC shown in FIG. 9 will be described with reference to FIG. 10.

Operation

In a period A, a signal voltage Vsig, a voltage Va from the voltage generating circuit 240, and a reference wave Vref are set to fixed voltages. An output of the comparator 210 is determined by the control circuit 230, and the output voltage Va of the voltage generating circuit 240 is switched.

When the output of the comparator 210 is 0 V, the control circuit 230 generates the fixed voltage Va using the voltage generating circuit 240, and changes the input range of the ADC 200C.

Next, in a period B', on the basis of the setting of the control circuit 230, a counter value corresponding to a voltage generated at that time using the voltage generating circuit 240 is set as an initial value in the counter 220.

Next, in a period B, a stepped reference voltage Vref is generated, and a count operation is performed, thereby performing AD conversion.

The AD converting method described in the above description of the operation is a method of performing AD conversion by performing counting after setting a value in the memory 270 as an initial value in the counter 220. Alternatively, the following AD converting methods can also be performed.

That is, for example, a method of performing AD conversion by performing a count operation, adding a value in the memory 270 and a counter value, and outputting the sum, or a method of separately outputting a counter value and a memory value and combining the counter value and the memory value using a logic circuit can also be employed.

According to the second embodiment in comparison to the first embodiment, the foregoing AD conversion can be performed in the ADC 200C.

When this ADC 200C is applied to a column-ADC solid-state image pickup device, an output signal from a pixel is input as the input signal Vsig shown in FIG. 9 to the comparator 210, and a signal generated by the DAC 160 is input as the reference signal Vref shown in FIG. 9 to the comparator 210. Also, a data output shown in FIG. 9 is input to the amplifier circuit 170 of the solid-state image pickup device.

In this case, the reference signal Vref is common on a column-by-column basis.

Next, a specific exemplary structure of the ADC according to the second embodiment will now be described.

Figure 11:
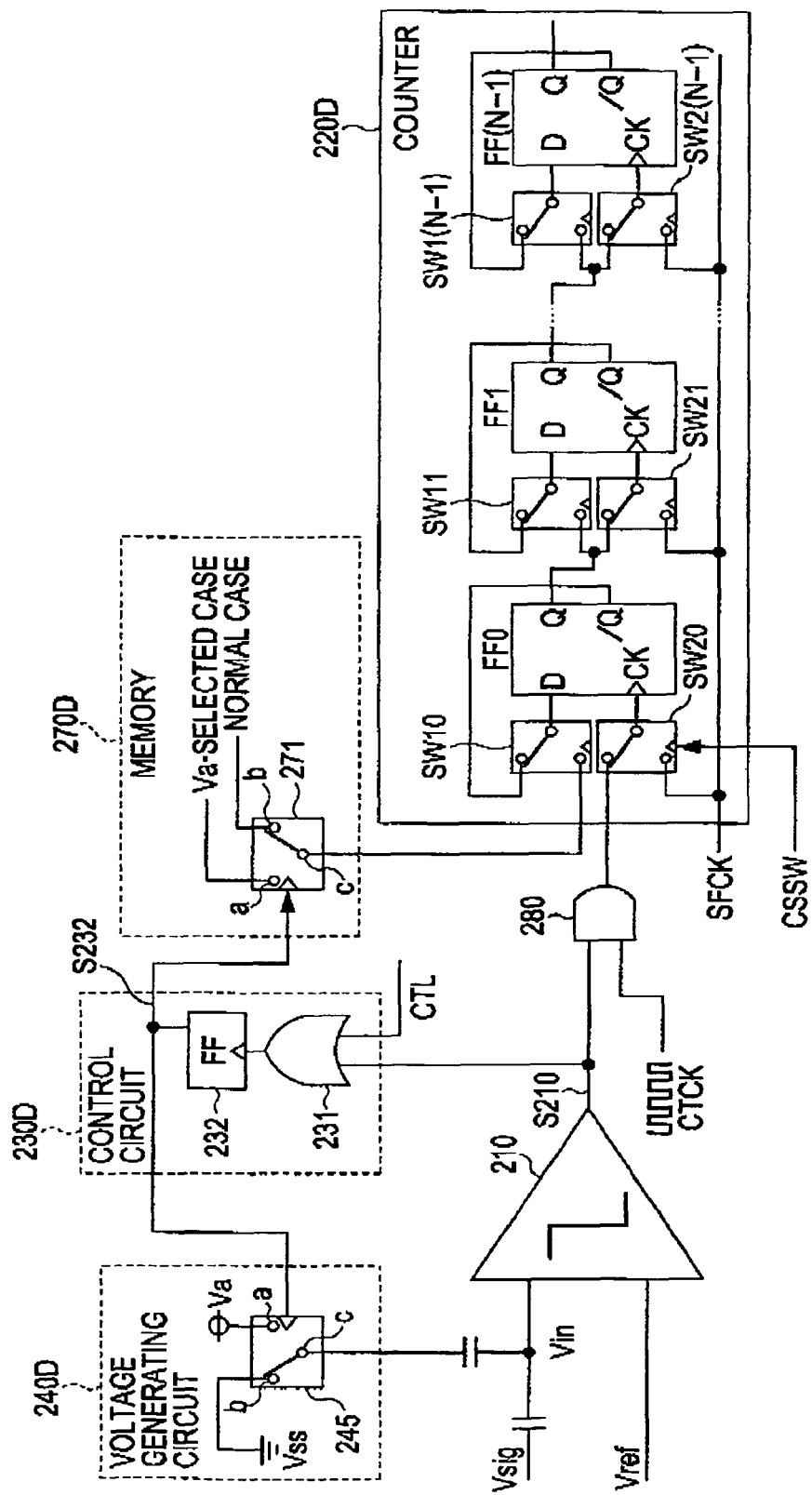
FIG. 11 is a circuit diagram showing an exemplary structure of the ADC according to the second embodiment.

FIG. 11 is a block diagram showing an exemplary structure of the ADC according to the second embodiment.

Referring to FIG. 11, a counter 220D includes flip flops FF0 to FF(N-1) capable of performing serial input/output, switches SW10 to SW1(N-1) arranged at data-input-D input stages of the flip flops FF0 to FF(N-1), respectively, and switches SW20 to SW2(N-1) arranged at clock-input-CK input stages of the flip flops FF0 to FF(N-1), respectively.

In the counter 220D, the switch SW10 has a terminal a connected to an inverted output /Q ("/" indicates inversion) of the flip flop FF0, a terminal b connected to an output of a counter-initial-value-input selecting circuit 271 included in a memory 270D, and a terminal c connected to the data input D of the flip flop FF0.

The switch SW11 has a terminal a connected to an inverted output /Q of the flip flop FF1, a terminal b connected to a data output Q of the flip flop FF0 at the previous stage, and a terminal c connected to the data input D of the flip flop FF1.

Similarly, the switch SW1(N-1) has a terminal a connected to an inverted output /Q of the flip flop FF(N-1), a terminal b connected to a data output Q of the flip flop FF(N-2) at the previous stage, and a terminal c connected to the data input D of the flip flop FF(N-1).

In the counter 220D, the switch SW20 has a terminal a connected to an output of a 2-input AND gate 280, a terminal b connected to a line for supplying a shift register clock signal SFCK, and a terminal c connected to the clock input CK of the flip flop FF0.

The switch SW21 has a terminal a connected to the data output Q of the flip flop FF0 at the previous stage, a terminal b connected to the line for supplying the shift register clock signal SFCK, and a terminal c connected to the clock input CK of the flip flop FF1.

Similarly, the switch SW2(N-1) has a terminal a connected to the data output Q of the flip flop FF(N-2) at the previous stage, a terminal b connected to the line for supplying the shift register clock signal SFCK, and a terminal c connected to the clock input CK of the flip flop FF(N-1).

The 2-input AND gate 280 has one input connected to an output of the comparator 210, the other input connected to a line for supplying a counter clock signal CTCK, and an output connected to the terminal b of the switch SW20 in the counter 220D.

The switches SW10 to SW1(N-1) and the switches SW20 to SW2(N-1) in the counter 220D are controlled to be switched in response to a counter-shift register switching signal (hereinafter called a "switching signal") CSSW.

Regarding the switches SW10 to SW1(N-1) and the switches SW20 to SW2(N-1), if the switching signal CSSW is at a high level (counter mode), the terminal a is connected to the terminal c; if the switching signal CSSW is at a low level (shift register mode), the terminal b is connected to the terminal c.

Figure 12:
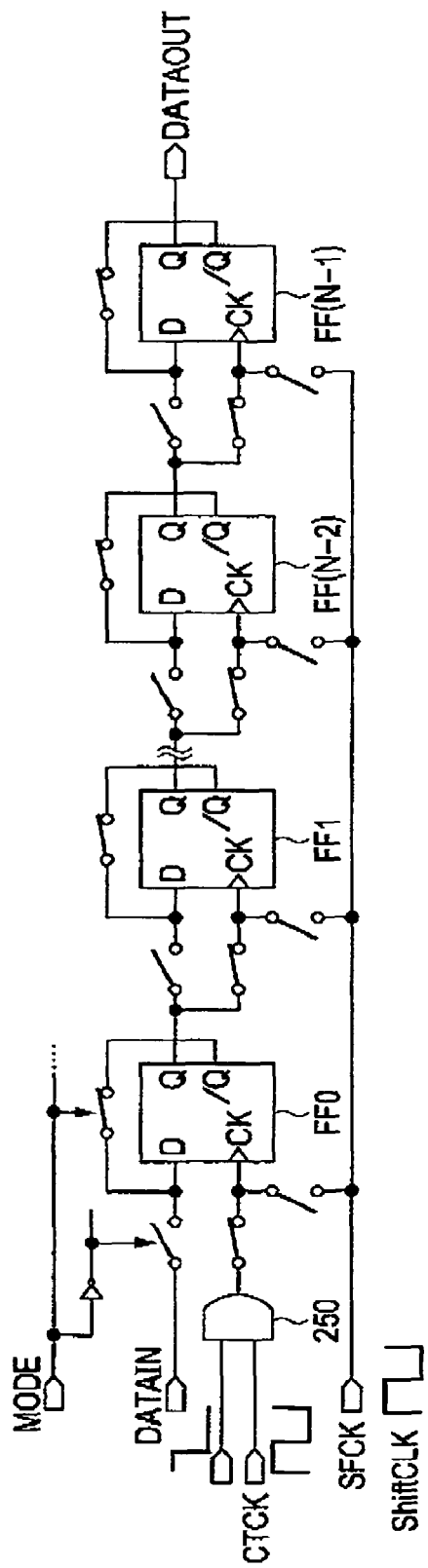
FIG. 12 is a diagram schematically showing a structure including connection states of switches in a counter in a counter mode.

FIG. 12 is a diagram schematically showing a structure including connection states of the switches in the counter in the counter mode.

Figure 13:
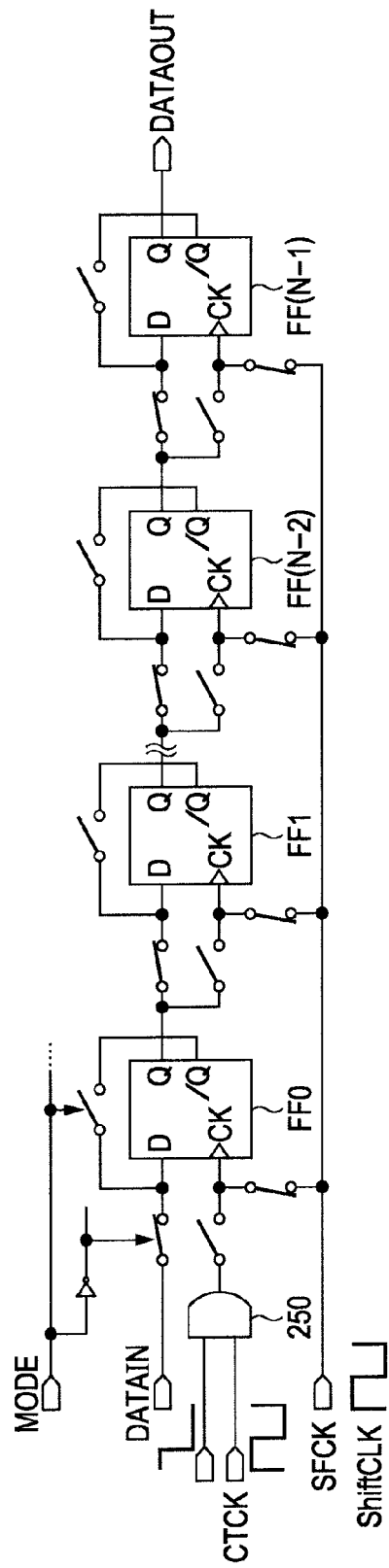
FIG. 13 is a diagram schematically showing a structure including connection states of the switches in the counter in a shift register mode.

FIG. 13 is a diagram schematically showing a structure including connection states of the switches in the counter in the shift register mode.

In the counter 220D in the counter mode, as shown in FIG. 12, when the output of the comparator 210 is at a high level, the flip flop FF0 at the first stage receives a counter clock signal CTCK at the clock input CK and latches inverted output data thereof.

The flip flops FF1 to FF(N-1) at the second stage and onward receive data outputs of the flip flop FF0 to FF(N-2) at the respective previous stages and latch inverted output data thereof.

In the counter 220D in the shift register mode, as shown in FIG. 13, the flip flops FF0 to FF(N-1) are cascade-connected, and a shift register clock signal SFCK is input to the clock inputs CK of the flip flop FF0 to FF(N-1).

An output of the counter-initial-value-input selecting circuit 271 is input to the data input D of the flip flop FF0 at the first stage.

The control circuit 230D includes the 2-input OR gate 231 and the flip flop 232.

The output S210 of the comparator 210 is supplied to one input of the OR gate 231, and a control signal CTL is supplied to the other input of the OR gate 231.

An output of the OR gate 231 is connected to a clock input CK of the flip flop 232. A data output Q of the flip flop 232 is supplied as a control signal S232 to the voltage generating circuit 240D.

The voltage generating circuit 240D includes the switch circuit 245.

The switch circuit 245 has a terminal a connected to a power supply potential Va, a terminal b connected to a reference potential Vss, and a terminal c connected to the capacitor C2. The switch circuit 245 switches between connection of the terminal c with the terminal a and connection of the terminal c with the terminal b in accordance with the control signal S232 from the control circuit 230D.

The memory 270D includes the counter-initial-value-input selecting circuit 271.

The counter-initial-value-input selecting circuit 271 has a terminal a connected to a Va-selected initial value input line, a terminal b connected to a normal initial value input line, and a terminal c connected to the terminal b of the flip flop FF10 in the counter 220D.

The counter-initial-value-input selecting circuit 271 switches between connection of the terminal c with the terminal a and connection of the terminal c with the terminal b in accordance with the control signal S232 from the control circuit 230D.

In this manner, this structure is an example using the counter 220D, which can perform a shift register operation. Since the counter is implemented by a shift register, an initial value can be selected. In the foregoing example, two initial values can be set using the output control signal S232 from the control circuit 230D.

Figure 14:
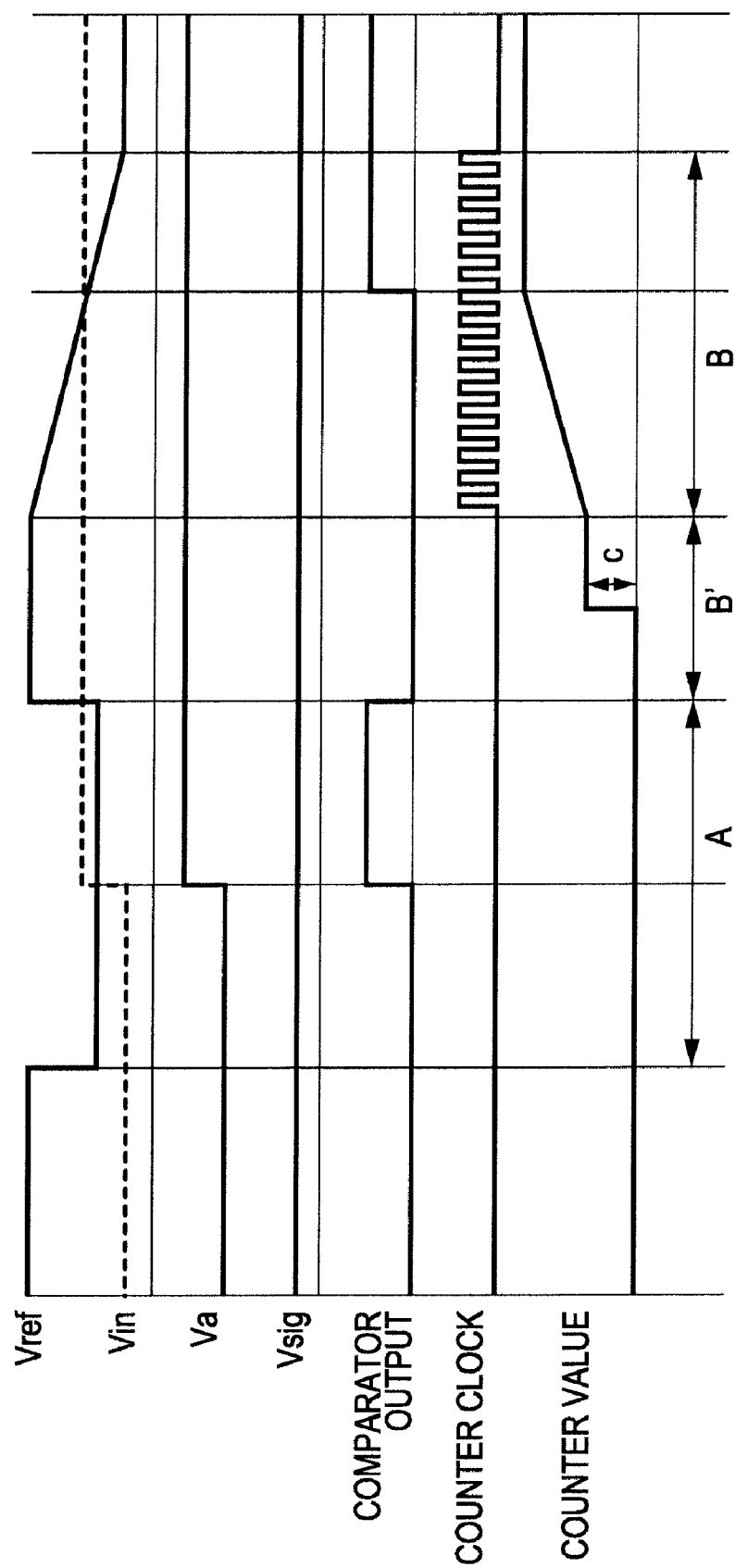
FIG. 14 is a timing chart for illustrating the operation of the ADC shown in FIG. 11.

FIG. 14 is a timing chart for illustrating the operation of the ADC shown in FIG. 11.

Hereinafter, the operation of the ADC shown in FIG. 11 will be described with reference to FIG. 14.

Operation

Prior to a period A, AD conversion is performed in each of the case of 0 V and the case of Va (this is because voltages generated by the voltage generating circuit 240D are 0 V and Va in this example; when various voltages are generated, AD conversion is performed in the case of each of the generated voltages), and a count difference between the cases of 0 V and Va generated using the voltage generating circuit 240D is separately measured. This count difference is saved in the memory 270D, or the DSP at a subsequent stage.

In the period A, the comparator 210 performs a comparison operation and determines the operation of the voltage generating circuit 240D to which the voltage when an output of the comparator 210 changes from low level to high level is added. At the same time, the counter initial value is selected.

In a period B', the initial value of the counter 220D is set. In FIG. 14, because there is the input voltage Va, the count difference serving as a counter value c is set as the initial value of the counter 220D at the time the voltage Va is input.

In a period B, the counter 220D performs a count operation. The result of the count operation is a corrected (including the count difference c) AD-converted value.

The counter-initial-value-input selecting circuit 271 shown in FIG. 11 selects the Va-selected initial value input when the input using the voltage generating circuit 240D is Va, and selects the normal initial value input when the input using the voltage generating circuit 240D is 0 V. In the case of Va, the count difference c is input as an initial value to the counter 220D.

This exemplary structure has advantages similar to the foregoing advantages.

Third Embodiment

Figure 15:
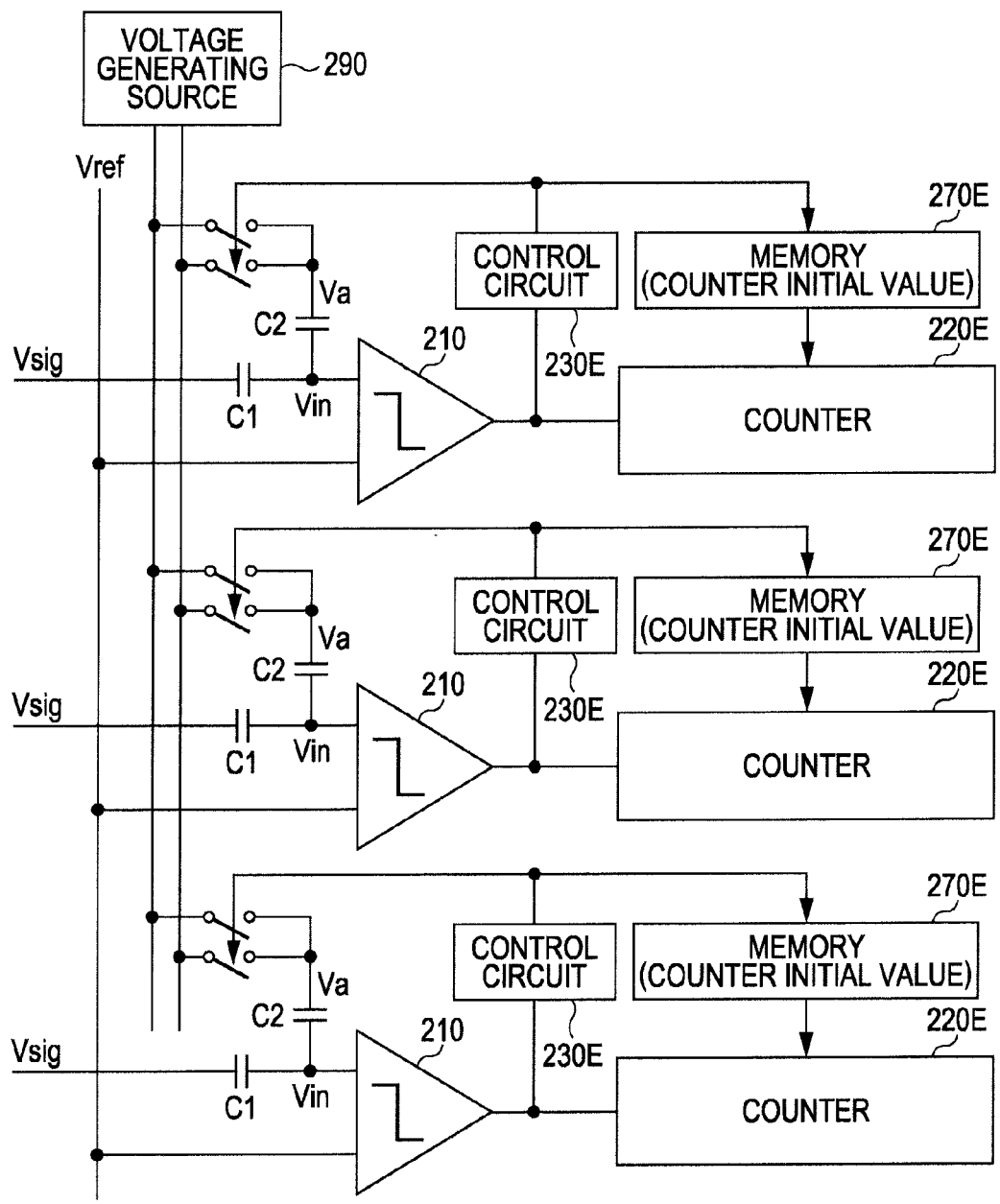
FIG. 15 is a circuit diagram showing an exemplary structure of an ADC according to a third embodiment.

FIG. 15 is a block diagram showing an exemplary structure of column-ADCs according to a third embodiment.

Column-ADCs according to the third embodiment each include, on a column-by-column basis, a counter 220E whose initial value can be set, and a memory 270E. In accordance with a signal from a control circuit 230E, different initial values of the counter 220E can be selected. The arrayed structure includes a common reference signal Vref and a common voltage generating source 290.

Referring to FIG. 15, the voltage generating source 290 is common to all columns and is arranged outside the column-ADCs. Since there is only one voltage generating source 290, the circuit dimensions are not much increased.

As a modification of the foregoing structure, a counter-initial-value memory may be shared by all columns, and the initial value of each counter 220E may be selected by a corresponding one of the control circuits 230E.

Alternatively, the structure may include a memory shared by all columns, and a memory for each column. High-order bits of the counter initial value are stored in the shared memory, and low-order bits (about two bits) that vary among the columns are stored in the memory of each column. Accordingly, variations from one column to another can be corrected. Since the variations from one column to another are limited to low-order bits, bits other than those having variations are held in the shared memory, and only bits having variations are independently held on a column-by-column basis.

The third embodiment has, besides advantages similar to those in the foregoing embodiments, the following advantages.

In the case of the column-ADCs, correction can be separately performed, and accordingly, variations can be suppressed.

As has been described above, according to this embodiment, a solid-state image pickup device includes the pixel section 110 in which a plurality of pixels that perform photoelectric conversion are arranged in a matrix, and the pixel-signal reading circuit (ADC group) 150 which reads data from the pixel section 110 on a row-by-row basis. The ADC group (pixel-signal reading circuit) 150 includes a plurality of columns of ADCs 200. Each ADC 200 includes the comparator 210 which compares a reference voltage Vslop, which has a ramp waveform obtained by changing a reference voltage generated by the DAC 160 to be a stepped voltage, with a corresponding one of analog signals (potential Vsl) obtained from pixels in each row through respective vertical signal lines; and the control unit 152 which includes a counter that counts a comparison time. The control unit 152 monitors the output of the comparator 210 and generates a DC voltage in accordance with the monitoring result. The control unit 152 performs analog addition of the generated DC voltage and the input analog signal, and supplies the sum signal to the analog-signal input terminal of the comparator 210.

In this embodiment, the comparator 210 compares the input signal voltage Vsig with the reference signal voltage Vref, and the control circuit 230E monitors the comparison result. When the input signal voltage Vsig is less than the reference signal voltage Vref, a voltage is added to the input signal voltage Vsig. For example, a counter value corresponding to the added voltage is stored in the memory. This operation is repeated until the total voltage of the input signal voltage Vsig and the added voltage becomes greater than or equal to the reference signal voltage Vref. The total voltage at the time the total voltage of the input signal voltage Vsig and the added voltage becomes greater than or equal to the reference signal voltage Vref is held. The counter value stored in the memory is set as an initial value in the counter. The held total voltage is compared with the reference signal voltage Vref. Therefore, the following advantages can be achieved.

The dynamic range of the ADC can be extended.

According to this embodiment, the speed of AD conversion can be increased. Furthermore, in comparison to the method of changing the reference wave, AD conversion can be performed with high precision.

In addition, the power consumption of the ADC and the DAC can be reduced.

In the case of the column-ADCs, correction can be separately performed, and accordingly, variations can be suppressed.

The solid-state image pickup device with these advantages is applicable as an image pickup device in a digital camera or a video camera.

Figure 16:
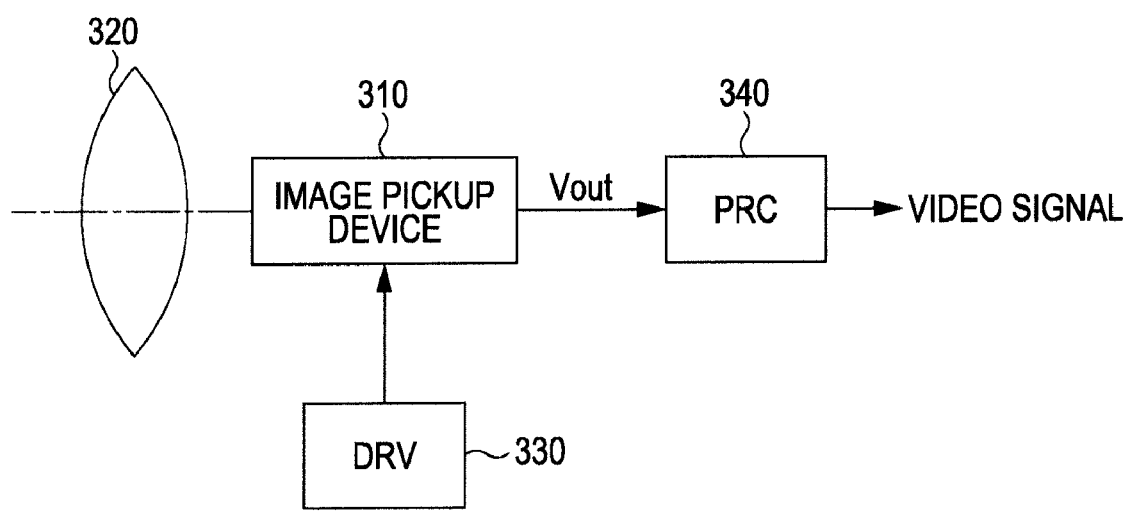
FIG. 16 is a diagram showing an exemplary structure of a camera system to which a solid-state image pickup device according to an embodiment of the present invention is applied.

FIG. 16 is a diagram showing an exemplary structure of a camera system to which a solid-state image pickup device according to an embodiment of the present invention is applied.

A camera system 300 includes, as shown in FIG. 16, an image pickup device 310 to which the solid-state image pickup device according to the embodiment is applicable, an optical system that directs incident light to a pixel region of the image pickup device 310 (that forms an image of a subject), a lens 320 that forms an image from the incident light on an image pickup face, a drive circuit (DRV) 330 that drives the image pickup device 310, and a signal processing circuit (PRC) 340 that processes an output signal of the image pickup device 310.

The drive circuit 330 includes a timing generator (not shown in FIG. 16) that generates various timing signals including a start pulse that drives circuits in the image pickup device 310, and a clock pulse. The drive circuit 330 drives the image pickup device 310 using a predetermined timing signal.

An image signal processed in the signal processing circuit 340 is recorded on a recording medium, such as a memory. A hard copy of the image information recorded on the recording medium is generated using a printer or the like. Also, the image signal processed in the signal processing circuit 340 is displayed as a moving image on a monitor including a liquid crystal display or the like.

As has been described above, an image pickup apparatus such as a digital still camera includes the above-described solid-state image pickup device 100 serving as the image pickup device 310, thereby realizing a highly precise camera.

The present application contains subject matter related to that disclosed in Japanese Priority Patent Application JP 2008-070012 filed in the Japan Patent Office on Mar. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-to-digital converter that converts an analog input signal into a digital signal, comprising:
   a comparator configured to change an output state when an input signal has a predetermined relationship with a reference signal;
   a counter configured to determine a relative time at which the comparator changes its output state;
   a voltage generating circuit configured to generate a direct current voltage if the comparator output is at a predetermined level; and
   an analog adder configured to add the voltage generated by the voltage generating circuit to the input signal and supply a sum signal to an input terminal of the comparator.

2. The analog-to-digital converter according to claim 1, wherein the voltage generated by the voltage generating circuit and the input single are each supplied via a capacitor.

3. The analog-to-digital converter according to claim 2, wherein the voltage generating circuit can generate a plurality of voltages, and
   wherein the plurality of voltages are supplied via different capacitors.

4. The analog-to-digital converter according to claim 1, further comprising a digital-signal correcting circuit configured to calculate an analog-to-digital-converted value using a signal obtained by the control circuit and an output signal of the counter.

5. The analog-to-digital converter according to claim 1, wherein the an initial value of the counter can be set, and
   wherein the analog-to-digital converter further comprises a selecting circuit that can select an arbitrary initial value from among a plurality of initial values of the counter, in accordance with a signal from the control circuit.

6. The analog-to-digital converter according to claim 5, wherein the counter includes a plurality of flip flops that can perform serial input/output, and the counter can operate in accordance with a counter mode and a shift register mode,
   wherein, in the counter mode, a data output of each of the plurality of flip flops is supplied to a clock input of a flip flop at a next stage, and, if the output of the comparator is at the predetermined level, the counter functions as a counter synchronized with a counter clock signal, and
   wherein, in the shift register mode, the plurality of flip flops are cascade-connected, the selected initial value is input to the counter, and the counter functions as a shift register synchronized with a shift register clock signal.

7. An analog-to-digital converting method comprising:
   comparing an input signal voltage with a reference signal voltage;
   adding a voltage to the input signal voltage if the input signal voltage is less than the reference signal voltage, and storing a counter value corresponding to the added voltage in a memory;
   storing information corresponding to the total voltage at the time the total voltage of the input signal voltage and the added voltage becomes greater than or equal to the reference signal voltage.

8. The analog-to-digital converting method according to claim 7, further comprising adding a counter value obtained by counting to the stored counter value, and outputting a sum counter value.

9. The analog-to-digital converting method according to claim 7, further comprising:
   combining counter values using a logic circuit at a subsequent stage.

10. A solid-state image pickup device comprising:
   a pixel section including a plurality of pixels arranged in a matrix, the plurality of pixels performing photoelectric conversion; and a pixel-signal reading circuit configured to read pixel signals from the pixel section in increments of multiple pixels, wherein the pixel-signal reading circuit includes a plurality of comparators arranged in correspondence with respective columns of the matrix of the plurality of pixels, each of the plurality of comparators comparing a voltage of a read signal input to the comparator with a voltage of a reference signal, and, if the voltage of the input signal has a predetermined relationship with a reference signal changing an output state of the comparator, and a plurality of control units whose operation is controlled in accordance with the outputs of the plurality of comparators, respectively, each of the plurality of control units including a counter configured to determine a relative time at which the comparator changes its output state for a corresponding one of the plurality of comparators, and wherein each of the plurality of control units includes a voltage generating circuit generating a direct current voltage if the comparator is at a predetermined level, and an analog adder configured to add the voltage generated by the voltage generating circuit to the input signal and supply a sum signal to an input terminal of the comparator.

11. The solid-state image pickup device according to claim 10, wherein the voltage generated by the voltage generating circuit and the input single are each supplied via a capacitor.

12. The solid-state image pickup device according to claim 11, wherein the voltage generating circuit can generate a plurality of voltages, and wherein the plurality of voltages are supplied via different capacitors.

13. The solid-state image pickup device according to claim 10, further comprising a digital-signal correcting circuit configured to calculate an analog-to-digital-converted value using a signal obtained by the control circuit and an output signal of the counter.

14. The solid-state image pickup device according to claim 10, wherein an initial value of the counter can be set, and wherein the solid-state image pickup device further comprises a selecting circuit that can select an arbitrary initial value from among a plurality of initial values of the counter, in accordance with a signal from the control circuit.

15. The solid-state image pickup device according to claim 14, further comprising a memory that holds the initial value of the counter and that is shared by all columns, wherein the initial value is selected by the control circuit on a column-by-column basis.

16. The solid-state image pickup device according to claim 14, further comprising:

a memory that holds high-order bits of the initial value of the counter and that is shared by all columns; and a memory that holds low-order bits of the initial value of the counter and that is provided for each column, wherein the initial value is selected by the control circuit on a column-by-column basis.

17. The solid-state image pickup device according to claim 14, wherein the counter includes a plurality of flip flops that can perform serial input/output, and the counter can operate in accordance with a counter mode and a shift register mode, wherein, in the counter mode, a data output of each of the plurality of flip flops is supplied to a clock input of a flip flop at a next stage, and, if the output of the comparator is at the predetermined level, the counter functions as a counter synchronized with a counter clock signal, and wherein, in the shift register mode, the plurality of flip flops are cascade-connected, the selected initial value is input to the counter, and the counter functions as a shift register synchronized with a shift register clock signal.

18. The solid-state image pickup device according to claim 10, further comprising a voltage generating source shared by all columns.

19. A camera system comprising:

a solid-state image pickup device; and an optical system that forms an optical image of a subject on the solid-state image pickup device, wherein the solid-state image pickup device includes a pixel section including a plurality of pixels arranged in a matrix, the plurality of pixels performing photoelectric conversion, and a pixel-signal reading circuit configured to read pixel signals from the pixel section in increments of multiple pixels, wherein the pixel-signal reading circuit includes a plurality of comparators arranged in correspondence with respective columns of the matrix of the plurality of pixels, each of the plurality of comparators comparing a voltage of a read signal input to the comparator with a voltage of a reference signal, and, if the voltage of the input signal has a predetermined relationship with a reference signal changing an output state of the comparator and a plurality of control units whose operation is controlled in accordance with the outputs of the plurality of comparators, respectively, each of the plurality of control units including a counter configured to determine a relative time at which the comparator changes its output state, and wherein each of the plurality of control units includes, and an analog adder configured to add a voltage generated by a voltage generating circuit to the input signal and supply a sum signal to an input terminal of the comparator.

* * * * *